United States Patent
Fujita et al.

(10) Patent No.: US 9,605,154 B2
(45) Date of Patent: Mar. 28, 2017

(54) CURABLE COLORING COMPOSITION, CURED FILM, COLOR FILTER, METHOD FOR MANUFACTURING COLOR FILTER, SOLID-STATE IMAGE PICKUP ELEMENT, PICTURE DISPLAY DEVICE, AND TRIARYLMETHANE COMPOUND

(71) Applicant: FUJIFILM Corporation, Tokyo (JP)

(72) Inventors: Akinori Fujita, Fujinomiya (JP);
Takashi Katoh, Fujinomiya (JP);
Satoshi Higuchi, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/064,718

(22) Filed: Mar. 9, 2016

(65) Prior Publication Data
US 2016/0185969 A1    Jun. 30, 2016

Related U.S. Application Data

(63) Continuation of application No. PCT/JP2014/073910, filed on Sep. 10, 2014.

(30) Foreign Application Priority Data

Sep. 17, 2013 (JP) .................................. 2013-191398
Nov. 29, 2013 (JP) .................................. 2013-247639

(51) Int. Cl.
| | | |
|---|---|---|
| G03F 7/004 | (2006.01) | |
| G02B 5/20 | (2006.01) | |
| C09B 11/12 | (2006.01) | |
| G02B 5/22 | (2006.01) | |
| C09B 11/26 | (2006.01) | |
| G02B 1/04 | (2006.01) | |
| G03F 7/00 | (2006.01) | |
| G03F 7/027 | (2006.01) | |
| G03F 7/105 | (2006.01) | |

(52) U.S. Cl.
CPC .............. *C09B 11/12* (2013.01); *C09B 11/26* (2013.01); *G02B 1/04* (2013.01); *G02B 5/223* (2013.01); *G03F 7/0007* (2013.01); *G03F 7/0046* (2013.01); *G03F 7/027* (2013.01); *G03F 7/105* (2013.01)

(58) Field of Classification Search
CPC ........ G03F 7/0007; G03F 7/004; G03F 7/028; G02F 1/1336; G02B 5/223; H01L 27/14; C09B 11/00; C09B 11/12; C09B 11/26
USPC ....... 430/7, 270.1, 281.1; 349/106; 257/440; 552/101, 108, 110, 111, 113, 114, 115
See application file for complete search history.

(56) References Cited

U.S. PATENT DOCUMENTS

| | | | |
|---|---|---|---|
| 7,740,995 B2 | 6/2010 | Aizawa et al. | |
| 8,197,994 B2 | 6/2012 | Mizukawa et al. | |
| 8,367,282 B2 | 2/2013 | Mizukawa et al. | |
| 8,779,159 B2 | 7/2014 | Mizukawa et al. | |
| 2007/0037076 A1 | 2/2007 | Aizawa et al. | |
| 2008/0076044 A1 | 3/2008 | Mizukawa et al. | |
| 2008/0213698 A1* | 9/2008 | Murai ..................... | C09B 11/20 430/283.1 |
| 2010/0230647 A1 | 9/2010 | Mizukawa et al. | |
| 2012/0138877 A1 | 6/2012 | Mizukawa et al. | |
| 2012/0238752 A1 | 9/2012 | Mizukawa et al. | |
| 2015/0060744 A1* | 3/2015 | Park ........................ | C09B 11/12 252/586 |
| 2016/0146987 A1 | 5/2016 | Ito et al. | |

FOREIGN PATENT DOCUMENTS

| | | |
|---|---|---|
| CN | 105408426 A | 3/2016 |
| JP | 3387541 B2 | 3/2003 |
| JP | 2007-039478 A | 2/2007 |
| JP | 2008-292970 A | 12/2008 |

(Continued)

OTHER PUBLICATIONS

Computer-generated translation of JP 2013-148889 (Aug. 2013).*
International Search Report of PCT/JP2014/073910 dated Nov. 25, 2014.
Written Opinion of PCT/JP2014/073910 dated Nov. 25, 2014.
International Preliminary Report on Patentability issued from the International Bureau in counterpart International Application No. PCT/JP2014/073910, mailed on Mar. 31, 2016.

(Continued)

*Primary Examiner* — John A McPherson
(74) *Attorney, Agent, or Firm* — Sughrue Mion, PLLC

(57) ABSTRACT

Provided are a curable coloring composition which is useful for formation of a colored pattern of a color filter, having high heat resistance, excellent solvent resistance, and a high voltage holding ratio; a color filter; a method for manufacturing a color filter; a solid-state image pickup element; a picture display device; and a triarylmethane compound. The curable coloring composition includes a triarylmethane compound having a structure represented by the following General Formula (1) and a structure represented by the following General Formula (2) in the same molecule.

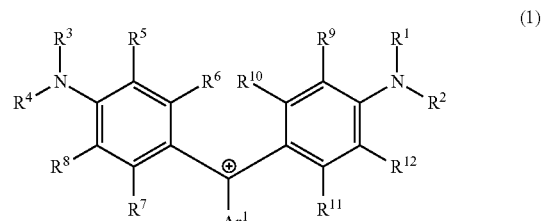

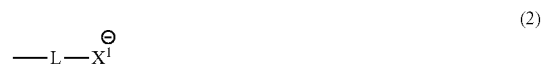

22 Claims, No Drawings

(56) References Cited

FOREIGN PATENT DOCUMENTS

| | | |
|---|---|---|
| JP | 2010-139560 A | 6/2010 |
| JP | 2012-108469 A | 6/2012 |
| JP | 2013-037316 A | 2/2013 |
| JP | 2013-072264 A | 4/2013 |
| JP | 2013-072265 A | 4/2013 |
| JP | 2013-087260 A | 5/2013 |
| JP | 2013-148889 A | 8/2013 |
| JP | 2014-196262 A | 10/2014 |
| JP | 2014-196394 A | 10/2014 |
| WO | 2010/123071 A1 | 10/2010 |
| WO | 2013/129576 A1 | 9/2013 |

OTHER PUBLICATIONS

Office Action dated Jun. 24, 2016, from the State Intellectual Property Office of People's Republic of China in counterpart Chinese Application No. 20148005802.1.
Office Action dated Dec. 20, 2016, from the Japanese Patent Office in counterpart Japanese Application No. 2013-247639.

* cited by examiner

CURABLE COLORING COMPOSITION, CURED FILM, COLOR FILTER, METHOD FOR MANUFACTURING COLOR FILTER, SOLID-STATE IMAGE PICKUP ELEMENT, PICTURE DISPLAY DEVICE, AND TRIARYLMETHANE COMPOUND

CROSS-REFERENCE TO RELATED APPLICATIONS

This application is a Continuation of PCT International Application No. PCT/JP2014/073910 filed on Sep. 10, 2014, which claims priority under 35 U.S.C §119(a) to Japanese Patent Application No. 2013-191398 filed on Sep. 17, 2013 and Japanese Patent Application No. 2013-247639 filed on Nov. 29, 2013. Each of the above application(s) is hereby expressly incorporated by reference, in its entirety, into the present application.

BACKGROUND OF THE INVENTION

1. Field of the Invention

The present invention relates to a curable coloring composition including a dye as a coloring compound, a cured film, a color filter, a method for manufacturing a color filter, a solid-state image pickup element, a picture display device, and a triarylmethane compound.

2. Description of the Related Art

As one of the methods for manufacturing a color filter which is used for a liquid crystal display device, a solid-state image pickup element, or the like, a pigment dispersion method has been widely used. As the pigment dispersion method, there is a method for manufacturing a color filter by photolithography, using a curable coloring composition which is obtained by dispersing pigments in various photosensitive compositions. This method is stable with respect to light or heat since it contains a pigment, and secures position precision due to patterning by photolithography. Thus, the method is a method which is suitable for the manufacture of a color filter for color display used for a liquid crystal display device, an organic electroluminescence (EL) display device, or the like.

As a coloring compound which is used for the manufacture of a color filter, not only a pigment but also a colorant compound other than a pigment, such as a dye, has been widely studied. Among these, as a dye, compounds having a wide variety of color parent materials, such as a pyrromethene-based dye, a pyrimidineazo-based dye, a pyrazoleazo-based dye, a xanthene-based dye, and a triarylmethane-based dye are known (see, for example, JP2012-108469A, WO2010-123071A, JP2013-87260A, JP2008-292970A, JP2007-039478A, and JP3387541B (JP1994-230210A (JP-H06-230210A))). Among these, JP2012-108469A, WO2010-123071A, and JP2013-87260A disclose a technique for obtaining high clarity, heat resistance, and fastness by using a triarylmethane-based dye

SUMMARY OF THE INVENTION

Use of a dye as a coloring compound is considered useful in that the hue or the luminance of a display image can be enhanced at a time of picture display due to the color purity of the dye itself or the clarity of the hue. However, there is still room for improvement in the manufacture of a color filter using a dye and thus, in the present situation, there is demand for further improvements in electrical characteristics such as heat resistance, solvent resistance, and a voltage holding ratio.

The present invention has been made in consideration of the technology in the related art. That is, the present invention has an object to provide a curable coloring composition which is useful for forming a colored pattern which has high heat resistance, excellent solvent resistance, and a high voltage holding ratio.

Furthermore, the present invention has an object to provide a color filter capable of displaying an image having high luminance and high contrast, using the curable coloring composition of the present invention, a method for manufacturing the same, and a display device capable of providing a display with a good image quality, obtained by using the color filter. The present invention has another object to provide a novel triarylmethane compound which can be used for the production of the curable coloring composition of the present invention.

The present inventors have conducted extensive studies in order to solve the above-described problems, and as a result, they have found that high heat resistance, excellent solvent resistance, and a high voltage holding ratio can be accomplished by incorporating a triarylmethane structure and an anionic site in the same molecule, thereby completing the present invention.

Specifically, the above object was accomplished by the following means <1>, and more preferably by <2> to <20>.

<1> A curable coloring composition including a triarylmethane compound having a structure represented by the following General Formula (1) and a structure represented by the following General Formula (2) in the same molecule:

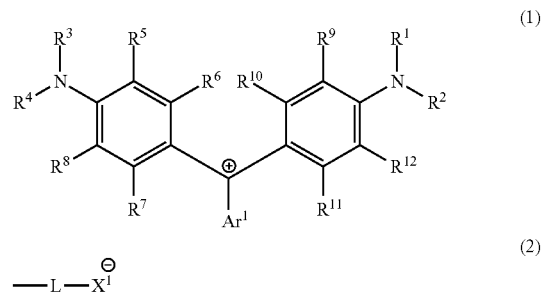

General Formula (2A)

-L$^1$-(structure represented by General Formula (2)) (in General Formula (1), R$^1$ to R$^4$ each independently represent a hydrogen atom, an alkyl group which may be substituted with the structure represented by General Formula (2), or an aryl group which may be substituted with the structure represented by General Formula (2), R$^5$ to R$^{12}$ each independently represent a hydrogen atom, an alkyl group which may be substituted with the structure represented by General Formula (2), a structure represented by General Formula (2A), or a structure represented by General Formula (2), Ar$^1$ represent a phenyl group which may have a substituent, a naphthyl group which may have a substituent, or a heteroaromatic group which may have a substituent, and these groups may further be substituted with the structure represented by General Formula (2) or the structure represented by General Formula (2A); and in General Formula (2), in the case where X$^1$ is an —SO$_3$ group, L represents a fluorine-substituted alkylene group or a fluorine-substituted phenylene group, and in the case where $X^1$ is $-SO_2NR^{30}$, L represents a single bond, a fluorine-substituted alkylene group, or a fluorine-substituted phenylene group, and $R^{30}$ represents an electron-withdrawing group, and in General Formula (2A), $L^1$ represents a divalent linking group).

<2> A curable coloring composition including a triarylmethane compound having a structure represented by the following General Formula (1) and a structure represented by the following General Formula (2) in the same molecule;

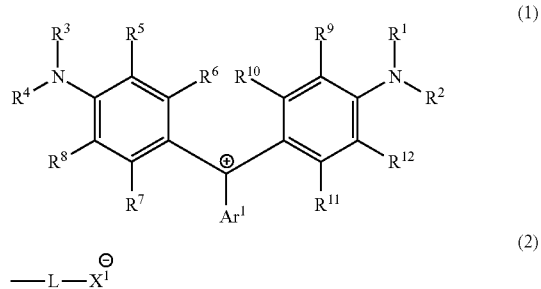

(1)

(2)

—L—X$^1$$^\ominus$ (in General Formula (1), $R^1$ to $R^4$ each independently represent a hydrogen atom, an alkyl group which may be substituted with the structure represented by General Formula (2), or an aryl group which may be substituted with the structure represented by General Formula (2), $R^5$ to $R^{12}$ each independently represent a hydrogen atom, an alkyl group which may be substituted with the structure represented by General Formula (2), or a structure represented by General Formula (2), $Ar^1$ represents a phenyl group which may have a substituent, a naphthyl group which may have a substituent, or a heteroaromatic group which may have a substituent, and these groups may further be substituted with the structure represented by General Formula (2); and in General Formula (2), in the case where $X^1$ is an $-SO_3$ group, L represents a fluorine-substituted alkylene group or a fluorine-substituted phenylene group, and in the case where $X^1$ is $-SO_2NR^{30}$, L represents a single bond, a fluorine-substituted alkylene group, or a fluorine-substituted phenylene group, and $R^{30}$ represents an electron-withdrawing group).

<3> The curable coloring composition as described in <1> or <2>, in which $R^{30}$ is a halogen-substituted alkylsulfonyl group, a halogen-substituted arylsulfonyl group, a halogen-substituted alkylcarbonyl group, or a halogen-substituted arylcarbonyl group.

<4> The curable coloring composition as described in any one of <1> to <3>, in which in General Formula (1), $Ar^1$ is represented by any one of the following General Formulae (3) to (5):

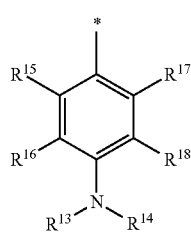

(3)

-continued

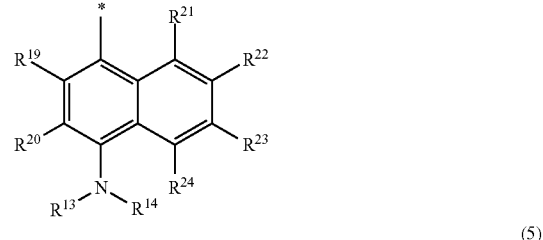

(4)

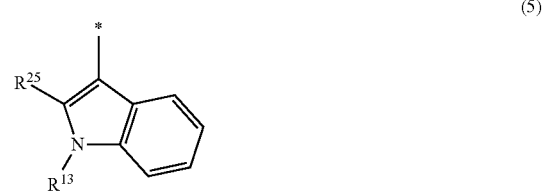

(5)

(in General Formulae (3) to (5), $R^{13}$ to $R^{25}$ each independently represent a hydrogen atom, a structure represented by General Formula (2A), an alkyl group which may be substituted with the structure represented by General Formula (2), or an aryl group which may be substituted with the structure represented by General Formula (2); and * represents a site of bonding to a carbon atom in General Formula (1)).

<5> The curable coloring composition as described in any one of <1> to <3>, in which in General Formula (1), $Ar^1$ is represented by any one of the following General Formulae (3) to (5):

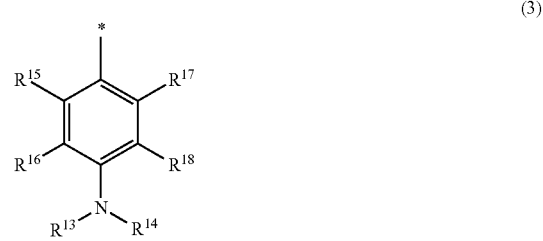

(3)

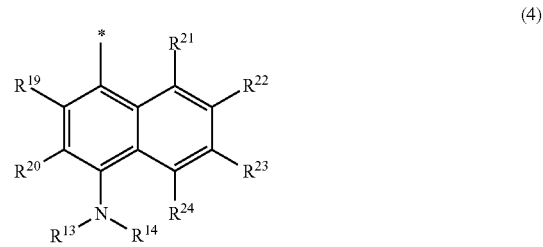

(4)

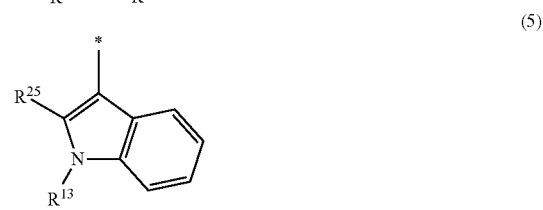

(5)

(in General Formulae (3) to (5), $R^{13}$ to $R^{25}$ each independently represent a hydrogen atom, an alkyl group which may be substituted with the structure represented by General Formula (2), or an aryl group which may be substituted with the structure represented by General Formula (2); and * represents a site of bonding to a carbon atom in General Formula (1)).

<6> The curable coloring composition as described in any one of <1> to <5>, in which at least one of $R^1$, $R^2$, $R^3$, $R^4$, and $Ar^1$ in General Formula (1) is substituted with the structure represented by General Formula (2).

<7> The curable coloring composition as described in any one of <1> to <5>, in which at least one of $R^7$ and $R^{12}$ in General Formula (1) is a structure represented by General Formula (2A) and/or the structure represented by General Formula (2A) is substituted with $Ar^1$.

<8> The curable coloring composition as described in any one of <1> to <7>, in which the alkyl group which may be substituted with the structure represented by General Formula (2) is represented by the following General Formula (2B), and the aryl group which may be substituted with the structure represented by General Formula (2) is represented by the following General Formula (2C):

General Formula (2B)
-alkylene group-$L^2$-structure represented by General Formula (2)
(in General Formula (2B), $L^2$ represents a divalent linking group);

General Formula (2C)
-arylene group-$L^3$-structure represented by General Formula (2)
(in General Formula (2C), $L^3$ represents a divalent linking group).

<9> The curable coloring composition as described in any one of <1> to <8>, in which in General Formula (2), $X^1$ is represented by —$SO_2NSO_2R^{26}$ or —$SO_2NCOR^{27}$, provided that $R^{26}$ and $R^{27}$ each independently represent a fluorine-substituted alkyl group or a fluorine-substituted aryl group.

<10> The curable coloring composition as described in any one of <1> to <9>, in which at least one of R', $R^2$, $R^3$ and $R^4$ in General Formula (1), $R^{13}$ and $R^{14}$ in General Formula (3) or (4), and $R^{13}$ in General Formula (5) is substituted with the structure represented by General Formula (2).

<11> The curable coloring composition as described in any one of <1> to <9>, in which at least one of $R^7$ in General Formula (1), $R^{12}$ in General Formula (1), $R^{13}$ in General Formula (3), and $R^{14}$ in General Formula (3) is a structure represented by General Formula (2A).

<12> The curable coloring composition as described in any one of <1> to <11>, further including a polymerizing compound and a photopolymerization initiator.

<13> The curable coloring composition as described in any one of <1> to <12>, for use in forming a colored layer of a color filter.

<14> A cured film formed by curing the curable coloring composition as described in any one of <1> to <13>.

<15> A color filter including the cured film as described in <14>.

<16> A method for manufacturing a color filter, including a step of coating the curable coloring composition as described in any one of <1> to <13> onto a substrate to form a curable coloring composition layer, a step of patternwise exposing the curable coloring composition layer, and a step of removing an unexposed area by development to form a colored pattern.

<17> A method for manufacturing a color filter, including a step of coating the curable coloring composition as described in any one of <1> to <13> onto a substrate to form a curable coloring composition layer, and curing the layer to form a curable coloring composition layer, a step of forming a photoresist layer on the curable coloring composition layer, a step of patterning the photoresist layer by exposure and development to obtain a resist pattern, and a step of dry-etching the colored layer using the resist pattern as an etching mask.

<18> A color filter manufactured by the method for manufacturing a color filter as described in <16> or <17>.

<19> A solid-state image pickup element or a picture display device, including the color filter as described in <15> or <18>, or a color filter manufactured by the method for manufacturing a color filter as described in <16> or <17>.

<20> A triarylmethane compound represented by any one of the following formulae:

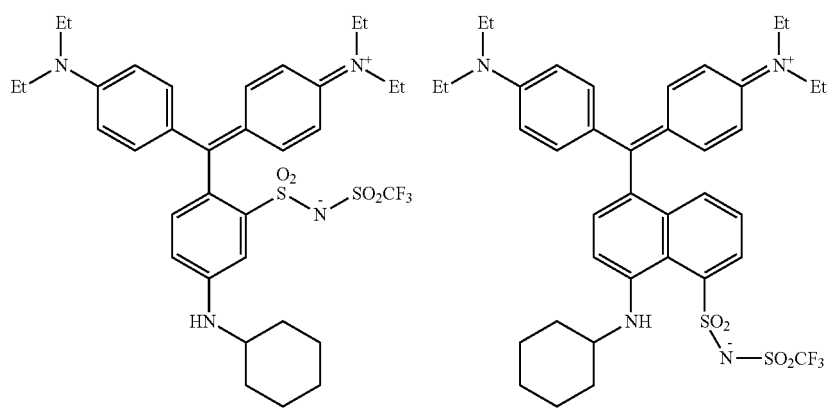

-continued

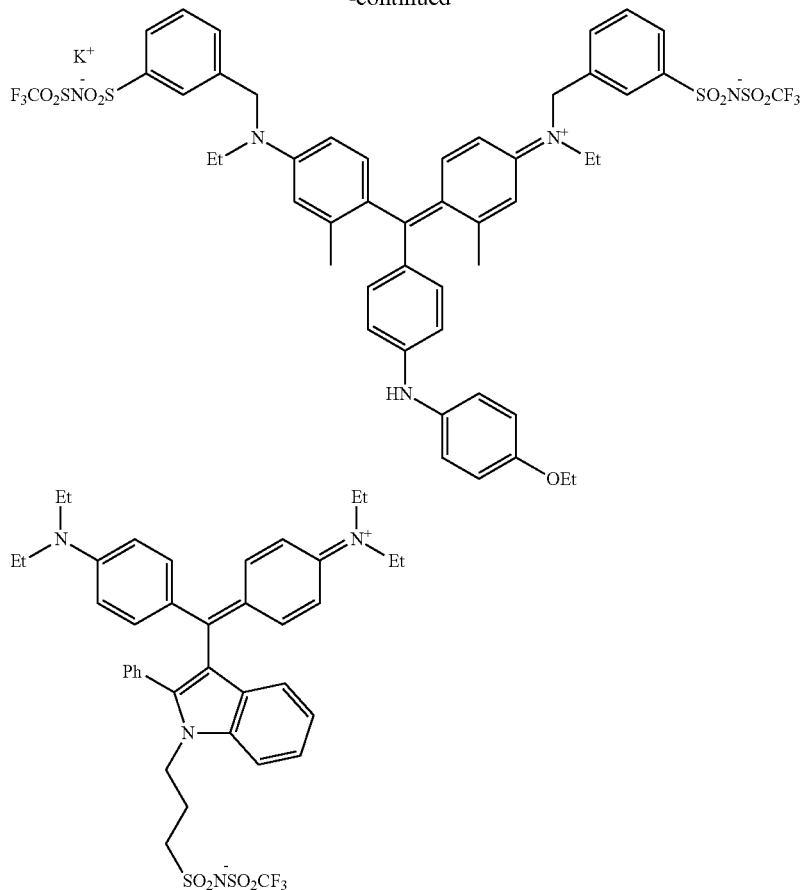

(in the formulae, Et represents an ethyl group and Ph represents a phenyl group).

According to the present invention, it became possible to provide a curable coloring composition which is useful for formation of a colored pattern of a color filter, having high heat resistance, excellent solvent resistance, and a high voltage holding ratio. It also became possible to provide a color filter using the curable coloring composition, a method for manufacturing the same, and a color filter. In addition, it became possible to provide a triarylmethane compound which can be used for production of the curable coloring composition of the present invention, or the like.

DESCRIPTION OF THE PREFERRED EMBODIMENTS

Hereinafter, the contents of the present invention will be described in detail. Further, in the present specification, "(a value) to ~(a value)" is used to mean a range including the numeral values represented before and after the range as a lower limit value and an upper limit value, respectively. In addition, the organic EL element in the present invention refers to an organic electroluminescence element.

Furthermore, in the present specification, "(meth)acrylate" represents both or either of acrylate and methacrylate, "(meth)acryl" represents both or either of acryl and methacryl, and "(meth)acryloyl" represents both or either of acryloyl and methacryloyl.

In addition, in the present specification, a "monomer material" and a "monomer" have the same definition. The monomer in the present specification refers to a compound which is distinguished from an oligomer and a polymer and has a weight-average molecular weight of 2,000 or less. In the present specification, a polymerizing compound refers to a compound having a polymerizable functional group, and may be a monomer or a polymer. The polymerizable functional group refers to a group involved in a polymerization reaction.

The weight average molecular weight and the number average molecular weight of the compound used in the present invention can be measured by a method using gel permeation chromatography (GPC) and is defined as a value in terms of polystyrene by GPC measurement. For example, the molecular weight can be determined with HLC-8220 by using TSKgel Super AWM-H (manufactured by Tosoh Corporation, 6.0 mm ID×15.0 cm) as a column and a 10 mmol/L solution of lithium bromide in N-methylpyrrolidone (NMP) as an eluent.

In the present specification, Et and Ph in the chemical formulae represent an ethyl group and a phenyl group, respectively.

In the present specification, a term "step" includes not only an independent step, but also steps which are not clearly distinguished from other steps if an intended action of the steps is obtained.

The present invention has been realized in consideration of these circumstances, and has an object to provide a coloring composition having excellent color characteristics.

Furthermore, "the total solid content" described in the present specification represents a sum of the components excluding an organic solvent from the composition of a curable coloring composition.

<Curable Coloring Composition>

The curable coloring composition of the present invention may include a triarylmethane compound having a structure represented by General Formula (1) and a structure represented by General Formula (2) in the same molecule. If desired, the curable coloring composition may further include a polymerizing compound and a photopolymerization initiator.

Here, having the components in the same molecule means that a structure represented by General Formula (1) is bonded to a structure represented by General Formula (2) via one covalent bond or via two or more covalent bonds and an atom. The triarylmethane compound in the present invention is referred to as a so-called betaine structure, and may include an anionic structure having a counter cation and a cationic structure having a counter anion in the molecule within a range not departing from the gist of the present invention.

In the case where the triarylmethane compound has a counter cation, a counter cation with respect to the structure represented by General Formula (2) is preferable, and examples thereof include a sodium ion and a potassium ion.

<<Triarylmethane Compound>>

The curable coloring composition of the present invention may include a triarylmethane compound having a structure represented by the following General Formula (1) and a structure represented by the following General Formula (2) in the same molecule.

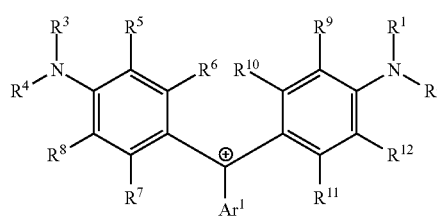

(1)

-continued

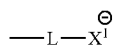

(2)

General Formula (2A)

-$L^1$-(structure represented by General Formula (2))

(in General Formula (1), $R^1$ to $R^4$ each independently represent a hydrogen atom, an alkyl group which may be substituted with the structure represented by General Formula (2), or an aryl group which may be substituted with the structure represented by General Formula (2), $R^5$ to $R^{12}$ each independently represent a hydrogen atom, an alkyl group which may be substituted with the structure represented by General Formula (2), a structure represented by General Formula (2A), or a structure represented by General Formula (2), $Ar^1$ represents a phenyl group which may have a substituent, a naphthyl group which may have a substituent, or a heteroaromatic group which may have a substituent, and these groups may further be substituted with the structure represented by General Formula (2) or the structure represented by General Formula (2A); and in General Formula (2), in the case where $X^1$ is an —$SO_3$ group, L represents a fluorine-substituted alkylene group or a fluorine-substituted phenylene group, in the case where $X^1$ is —$SO_2NR^{30}$, L represents a single bond, a fluorine-substituted alkylene group, or a fluorine-substituted phenylene group, and $R^{30}$ represents an electron-withdrawing group, and in General Formula (2A), $L^1$ represents a divalent linking group)

In the present invention, it is possible to accomplish high heat resistance, excellent solvent resistance, and a high voltage holding ratio by incorporating a triarylmethane compound having a triarylmethane structure and an anionic site in the same molecule. Further, a picture display device with a color filter obtained by using such a composition can meet both of a high luminance and a high contrast.

This mechanism is not necessarily clear, but it can be considered to be caused by the expression of stronger interaction between the anionic site and the cationic site by making the anionic site present in the molecule.

In the triarylmethane compound represented by General Formula (1) of the present invention, cations are present as delocalized as below, and thus, in the present specification, the methods describing the following two kinds of structures have the same meanings. Further, the cationic site may be in any position in the molecule, but it is preferably present on a nitrogen atom. When it is substituted on the nitrogen atom, there is a tendency that the color feel is further improved.

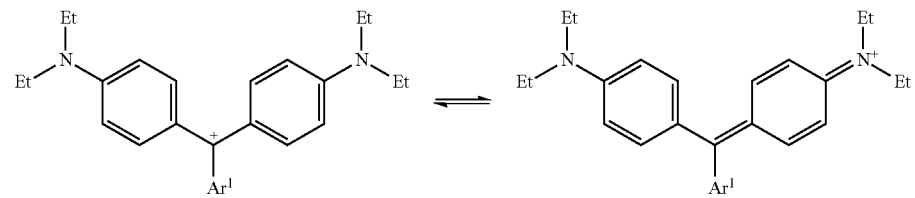

In General Formula (1), $R^1$ to $R^4$ each independently represent a hydrogen atom, an alkyl group which may be substituted with the structure represented by General Formula (2), or an aryl group which may be substituted with the structure represented by General Formula (2).

As the alkyl group, an alkyl group having 1 to 10 carbon atoms is preferable, and an alkyl group having 2 to 6 carbon atoms is more preferable. Specific examples of the alkyl group include a methyl group, an ethyl group, an isopropyl group, a tertiary butyl group, and a cyclohexyl group. Further, the alkyl group may have a substituent. Examples of the substituent which the alkyl group may include a halogen atom, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkylsulfonylamino or arylsulfonylamino group, a mercapto group, an alkylthio group, an arylthio group, a heterocyclic thio group, a sulfamoyl group, a sulfo group, an alkylsulfinyl or arylsulfinyl group, an alkylsulfonyl or arylsulfonyl group, an acyl group, an aryloxycarbonyl group, an alkoxycarbonyl group, a carbamoyl group, an arylazo group or a heterocyclic azo group, an imide group, a phosphino group, a phosphinyl group, a phosphinyloxy group, a phosphinylamino group, or a silyl group.

Furthermore, examples of the alkyl group which is substituted with the structure represented by General Formula (2) include —$C_3H_6SO_2NSO_2CF_3$.

Other examples of the alkyl group which may be substituted with the structure represented by General Formula (2) include those represented by the following General Formula (2B).

General Formula (2B)
-alkylene group-$L^2$-structure represented by General Formula (2)

In General Formula (2B), $L^2$ represents a divalent linking group, —$NR^{11}$—, —O—, —$SO_2$—, a fluorine-substituted alkylene group, a fluorine-substituted phenylene group, or a group formed by combination of these groups.

$L^2$ is particularly preferably a group formed by combination of —O— and —$SO_2$, a group formed by combination of —O— and a fluorine-substituted phenylene group, a group formed by combination of —O—, —$SO_2$, and a fluorine-substituted alkylene group, or a group formed by combination of —$NR^{11}$—, —$SO_2$, and a fluorine-substituted alkylene group.

In —$NR^{11}$—, $R^{11}$ represents a hydrogen atom or an alkyl group having 1 to 5 carbon atoms, with the hydrogen atom being preferable.

The fluorine-substituted alkylene group is preferably a fluorine-substituted alkylene group having 1 to 10 carbon atoms, more preferably a fluorine-substituted alkylene group having 1 to 6 carbon atoms, and still more preferably a fluorine-substituted alkylene group having 1 to 3 carbon atoms. These alkylene groups are each more preferably a perfluoroalkylene group. Specific examples of the fluorine-substituted alkylene group include a difluoromethylene group, a tetrafluoroethylene group, and a hexafluoropropylene group.

The fluorine-substituted phenylene group is preferably a fluorine-substituted phenylene group having 6 to 20 carbon atoms, more preferably a fluorine-substituted phenylene group having 6 to 14 carbon atoms, and still more preferably a fluorine-substituted phenylene group having 6 to 10 carbon atoms. Specific examples of the fluorine-substituted phenylene group include a tetrafluorophenylene group, a hexafluoro-1-naphthylene group, and a hexafluoro-2-naphthylene group.

Among these alkyl groups, particularly preferable examples of the alkyl group include an ethyl group, an isopropyl group, a cyclohexyl group, a methacryloyloxyethyl group, and —$C_3H_6SO_2NSO_2CF_3$.

In addition, —$C_2H_4OSO_2(CF_2)_3SO_2NSO_2CF_3$, —$C_3H_6OSO_2(CF_2)_3NSO_2CF_3$, —$C_2H_4NHSO_2(CF_2)_3NSO_2CF_3$, the following groups, and the like are also preferable.

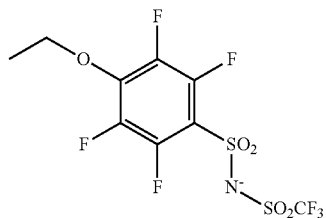

The aryl group is preferably an aryl group having 6 to 20 carbon atoms, and more preferably an aryl group having 6 to 10 carbon atoms. Specific examples of the aryl group include a phenyl group and a naphthyl group.

Furthermore, examples of the aryl group which is substituted with the structure represented by General Formula (2) include a 3-($CF_3SO_2NSO_2$)phenyl group.

Among these aryl groups, particularly preferred examples of the aryl group include a phenyl group.

Moreover, other examples of the aryl group which may be substituted with the structure represented by General Formula (2) include those the following General Formula (2C).

General Formula (2C)
-arylene group-$L^3$-structure represented by General Formula (2)

In General Formula (2C), $L^3$ represents a divalent linking group and has the same definition as $L^2$ in General Formula (2B), and a preferred range thereof is also the same.

For example, the following groups are also exemplified.

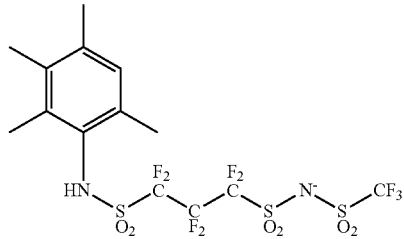 [SMILES: Cc1cc(C)c(NS(=O)(=O)C(F)(F)C(F)(F)C(F)(F)S(=O)(=O)[N-]S(=O)(=O)C(F)(F)F)c(C)c1C]

The alkyl group which may be substituted with the structure represented by General Formula (2), and the aryl group which may be substituted with the structure represented by General Formula (2) may have other substituents. Examples of the substituent other than the structure represented by General Formula (2) include reactive groups such as a halogen atom, an alkyloxy group, an aryloxy group, an aryl group, a methylcarbonyloxy group, an alkyloxycarbonyl group, a vinyl group, and a methacryloyl group.

Examples of the alkyl group or the aryl group, having a substituent other than the structure represented by General Formula (2), include a benzyl group, an ethoxyethyl group, a methylcarbonyloxyethyl group, a methacryloyloxyethyl group, a 2-methoxyphenyl group, a 4-ethoxycarbonylphenyl group, and a 4-vinylphenyl group.

$R^5$ to $R^{12}$ each independently represent a hydrogen atom, an alkyl group which may be substituted with the structure represented by General Formula (2), a structure represented by General Formula (2A) or a structure represented by General Formula (2), with the hydrogen atom or the structure represented by General Formula (2A) being preferable.

The structure represented by General Formula (2) in the alkyl group which may be substituted with the structure represented by General Formula (2) or the structure represented by General Formula (2) has the same definition as the structure represented by General Formula (2) which will be described later, and a preferred range thereof is also the same.

The alkyl groups represented by $R^5$ to $R^{12}$ have the same definitions as the alkyl groups represented by $R^1$ to $R^4$, and preferred ranges thereof are also the same.

General Formula (2A) is —O-structure represented by General Formula (2). In General Formula (2A), $L^1$ represents a divalent linking group, $-NR^{10}-$, $-O-$, $-SO_2-$, a fluorine-substituted alkylene group, a fluorine-substituted phenylene group, or a group formed by combination of these groups.

$L^1$ is particularly preferably a group formed by combination of $-SO_2$ and a fluorine-substituted alkylene group, a group formed by combination of $-NR^{10}-$, $-SO_2$, and a fluorine-substituted alkylene group, a group formed by combination of $-O-$, $-SO_2$, and a fluorine-substituted phenylene group, a group formed by combination of $-O-$, $-SO_2$, and a fluorine-substituted alkylene group, or a group formed by combination of $-O-$, a fluorine-substituted phenylene group, $-NR^{10}-$, $-SO_2$, and a fluorine-substituted alkylene group.

In $-NR^{10}-$, $R^{10}$ represents a hydrogen atom or an alkyl group having 1 to 5 carbon atoms, with the hydrogen atom being preferable.

The fluorine-substituted alkylene group is preferably a fluorine-substituted alkylene group having 1 to 10 carbon atoms, more preferably a fluorine-substituted alkylene group having 1 to 6 carbon atoms, and still more preferably a fluorine-substituted alkylene group having 1 to 3 carbon atoms. These alkylene groups are each more preferably a perfluoroalkylene group. Specific examples of the fluorine-substituted alkylene group include a difluoromethylene group, a tetrafluoroethylene group, and a hexafluoropropylene group.

The fluorine-substituted phenylene group is a fluorine-substituted phenylene group having 6 to 20 carbon atoms, more preferably a fluorine-substituted phenylene group having 6 to 14 carbon atoms, and still more preferably a fluorine-substituted phenylene group having 6 to 10 carbon atoms. Specific examples of the fluorine-substituted phenylene group include a tetrafluorophenyfene group, a hexafluoro-1-naphthylene group, and a hexafluoro-2-naphthylene group.

$Ar^1$ represents a phenyl group which may have a substituent, a naphthyl group which may have a substituent, or a heteroaromatic group which may have a substituent, and these groups may further be substituted with the structure represented by General Formula (2) or the structure represented by General Formula (2A), which will be described in later.

Examples of the heteroaromatic group include indole, phenothiazine, phenoxazine, and carbazole.

Examples of the substituent which the phenyl group, the naphthyl group, and the heteroaromatic group may have include a (di)alkylamino group, an arylamino group, an alkoxy group, and a halogen atom, and more preferably an alkylamino group and an arylamino group. Examples of General Formula (2) which may be substituted include an $-SO_2NSO_2CF_3$ group.

Examples of such the $Ar^1$ include a 2-methyl-4-cyclohexylaminophenyl group, a 4-cyclohexylaminonaphthyl group, and a 4-phenylaminophenyl group. Examples of $Ar^1$ in which General Formula (2) is substituted include a 2-($CF_3SO_2NSO_2$)-4-cyclohexylaminophenyl group and a 4-ethylamino-5-($CF_3SO_2NSO_2$) naphthyl group.

$Ar^1$ is preferably represented by the following General Formulae (3) to (5).

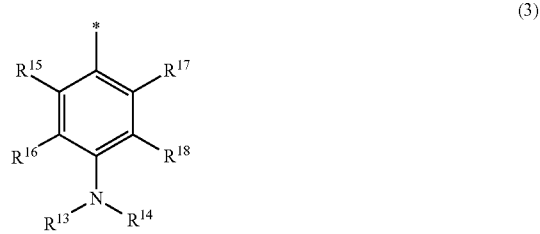

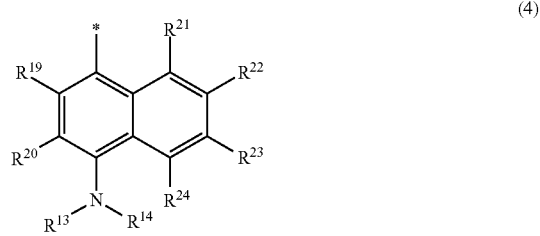

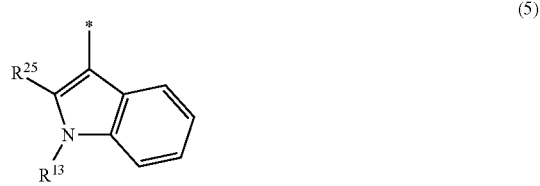

(in General Formulae (3) to (5), $R^{13}$ to $R^{25}$ each independently represent a hydrogen atom, structure represented by General Formula (2A), an alkyl group which may be substituted with the structure represented by General Formula (2), or an aryl group which may be substituted with the structure represented by General Formula (2), and * represents a site of bonding to a carbon atom in General Formula (1))

$R^{13}$ to $R^{25}$ each independently represent a hydrogen atom, an alkyl group which may be substituted with the structure represented by General Formula (2), or an aryl group which may be substituted with the structure represented by General Formula (2), and has the same definition as $R^1$ in General Formula (1), and a preferred range thereof is also the same.

$Ar^1$ is preferably represented by General Formulae (3) to (5), more preferably represented by General Formula (3) or (4), and still more preferably represented by General Formula (4). By using the structure represented by General Formula (4), the heat resistance tends to be further improved.

In General Formula (2), in the case where $X^1$ is an $-SO_3$ group, L represents a fluorine-substituted alkylene group or a fluorine-substituted phenylene group, and in the case where $X^1$ is $-SO_2NR^{30}$, L represents a single bond, a fluorine-substituted alkylene group, or a fluorine-substituted phenylene group, with the single bond being preferable. $R^{30}$ represents an electron-withdrawing group.

In the case where $X^1$ is an $-SO_3$ group or in the case where $X^1$ is $-SO_2NR^{30}$, the fluorine-substituted alkylene group represented by L is preferably a fluorine-substituted alkylene group having 1 to 10 carbon atoms, more preferably a fluorine-substituted alkylene group having 1 to 6 carbon atoms, and still more preferably a fluorine-substituted alkylene group having 1 to 3 carbon atoms. These alkylene groups are each more preferably a perfluoroalkylene group.

Specific examples of the fluorine-substituted alkylene group include a difluoromethylene group, a tetrafluoroethylene group, and a hexafluoropropylene group.

In the case where $X^1$ is an —$SO_3$ group or in the case where $X^1$ is an —$SO_2NR^{30}$, as the fluorine-substituted phenylene group represented by L, a fluorine-substituted phenylene group having 6 to 20 carbon atoms is preferable, a fluorine-substituted phenylene group having 6 to 14 carbon atoms is more preferable, and a fluorine-substituted phenylene group having 6 to 10 carbon atoms is still more preferable. Specific examples of the fluorine-substituted phenylene group include a tetrafluorophenylene group, a hexafluoro-1-naphthylene group, and a hexafluoro-2-naphthylene group.

As the electron-withdrawing group represented by $R^{30}$, a halogen-substituted alkylsulfonyl group, a halogen-substituted arylsulfonyl group, a halogen-substituted alkylcarbonyl group, or a halogen-substituted arylcarbonyl group is preferable. Examples of the halogen atom substituted include a fluorine atom, a chlorine atom, a bromine atom, and an iodine atom, with the fluorine atom being preferable.

As the halogen-substituted alkylsulfonyl group, a halogen-substituted alkylsulfonyl group having 1 to 10 carbon atoms is preferable, a halogen-substituted alkylsulfonyl group having 1 to 6 carbon atoms is more preferable, and a halogen-substituted alkylsulfonyl group having 1 to 3 carbon atoms is still more preferable. Specific examples of the halogen-substituted alkylsulfonyl group include a trifluoromethylsulfonyl group, a pentafluoroethylsulfonyl group, and a heptafluoropropylsulfonyl group, among which the trifluoromethylsulfonyl group is preferable.

As the halogen-substituted arylsulfonyl group, a halogen-substituted arylsulfonyl group having 6 to 20 carbon atoms is preferable, a halogen-substituted arylsulfonyl group having 6 to 14 carbon atoms is more preferable, and a halogen-substituted arylsulfonyl group having 6 to 10 carbon atoms is still more preferable. Specific examples of the halogen-substituted arylsulfonyl group include a pentafluorophenylsulfonyl group, a heptafluoro-1-naphthylsulfonyl group, and a heptafluoro-2-naphthylsulfonyl group.

As the halogen-substituted alkylcarbonyl group, a halogen-substituted alkylcarbonyl group having 1 to 10 carbon atoms is preferable, a halogen-substituted alkylcarbonyl group having 1 to 6 carbon atoms is more preferable, and a halogen-substituted alkylcarbonyl group having 1 to 3 carbon atoms is still more preferable. Specific examples of the halogen-substituted alkylcarbonyl group include a trifluoromethylcarbonyl group, a pentafluoroethylcarbonyl group, and a heptafluoropropylcarbonyl group.

As the halogen-substituted arylcarbonyl group, a halogen-substituted arylcarbonyl group having 6 to 20 carbon atoms is preferable, a halogen-substituted arylcarbonyl group having 6 to 14 carbon atoms is more preferable, and a halogen-substituted arylcarbonyl group having 6 to 10 carbon atoms is still more preferable. Specific examples of the halogen-substituted arylcarbonyl group include a pentafluorophenylcarbonyl group, a heptafluoro-1-naphthylcarbonyl group, and a heptafluoro-2-naphthylcarbonyl group.

$X^1$ is preferably represented by —$SO_2NSO_2R^{26}$ or —$SO_2NCOR^{27}$. That is, $R^{30}$ is preferably represented by —$SO_2R^{26}$ or —$COR^{27}$. $R^{26}$ and $R^{27}$ each independently represent a fluorine-substituted alkyl group or a fluorine-substituted aryl group.

As the fluorine-substituted alkyl group, a fluorine-substituted alkyl group having 1 to 10 carbon atoms is preferable, a fluorine-substituted alkyl group having 1 to 6 carbon atoms is more preferable, and a fluorine-substituted alkyl group having 1 to 3 carbon atoms is still more preferable. Specific examples of the fluorine-substituted alkyl group include a trifluoromethyl group, a pentafluoroethyl group, and a heptafluoropropyl group, an among which the trifluoromethyl group is preferable.

As the fluorine-substituted aryl group, a fluorine-substituted aryl group having 6 to 20 carbon atoms is preferable, a fluorine-substituted aryl group having 6 to 14 carbon atoms is more preferable, and a fluorine-substituted aryl group having 6 to 10 carbon atoms is still more preferable. Specific examples of the fluorine-substituted aryl group include a pentafluorophenyl group, a heptafluoro-1-naphthyl group, and a heptafluoro-2-naphthyl group.

It is preferable that the structure represented by General Formula (2) is substituted with at least one of $R^1$ to $R^{12}$, and $Ar^1$ in General Formula (1), and in order to effectively improve the color feel, it is more preferable that the structure is substituted with at least one of $R^1$ to $R^4$ and $Ar^1$ General Formula (1), whereby there is tendency that the color feel is further improved.

Moreover, it is also preferable that at least one of $R^7$ and $R^{12}$ in General Formula (1) is substituted with a structure represented by General Formula (2A) and/or the structure represented by General Formula (2A) is substituted with $Ar^1$. In addition, it is also preferable that at least one of $R^7$ in General Formula (1), $R^{12}$ in General Formula (1), $R^{13}$ in General Formula (3), and $R^{14}$ in General Formula (3) is a structure represented by General Formula (2A).

At one position in the General Formula (1) or at two or more positions may be substituted with the structure represented by General Formula (2). It is preferable that the structure is substituted at one or two positions in one molecule.

Hereinafter, specific examples of the triarylmethane compound having a structure represented by General Formula (1) and a structure represented by the following General Formula (2) in the same molecule are shown below, but it is needless to say that the present invention is not limited thereto.

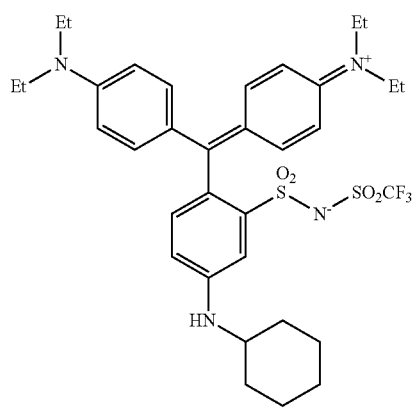
(I-1)
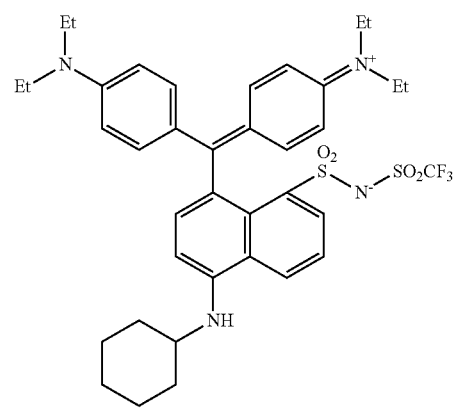
(I-2)
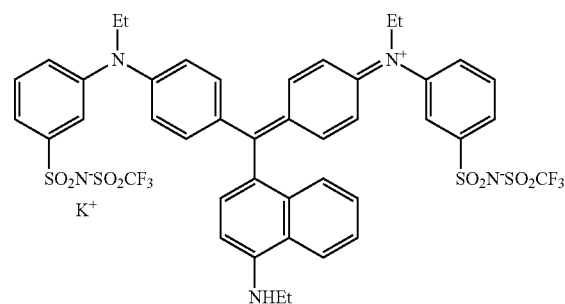
(I-3)
(I-4)
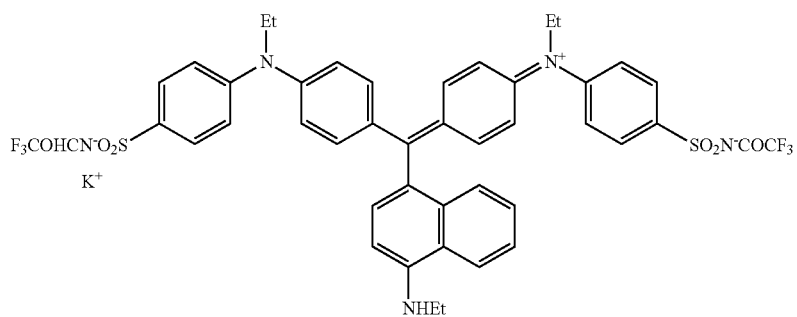
(I-5)
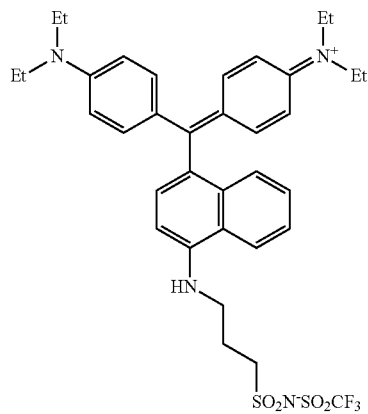
(I-6)
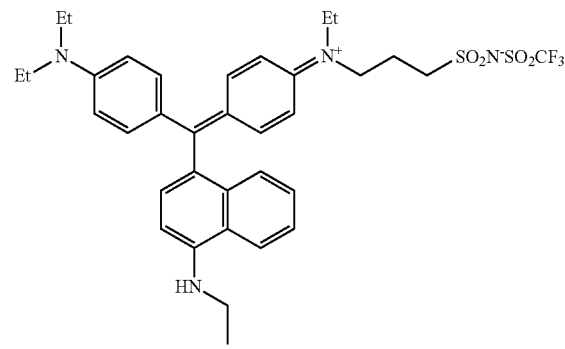
(I-7)

-continued
(I-8)
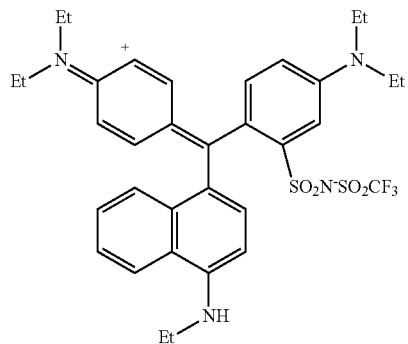
(I-9)
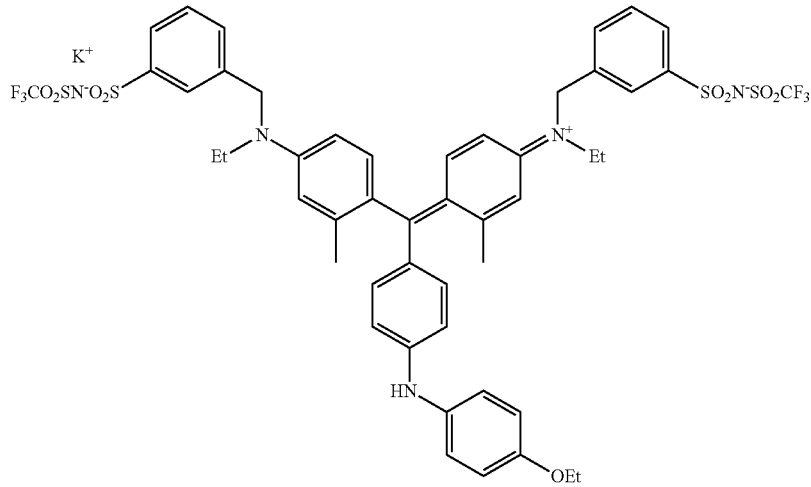
(I-10)
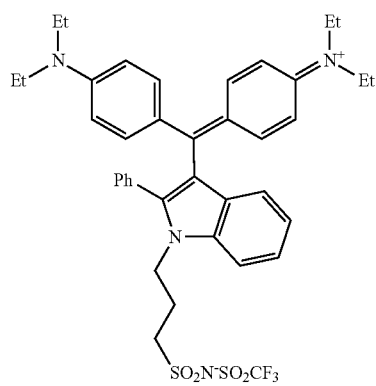
I-101
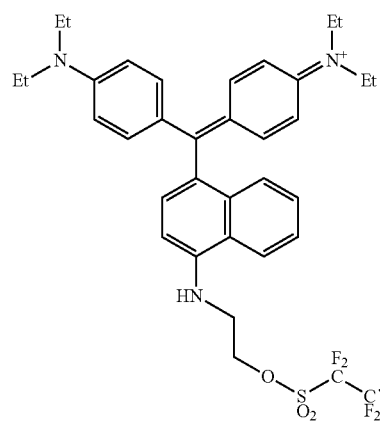
I-102
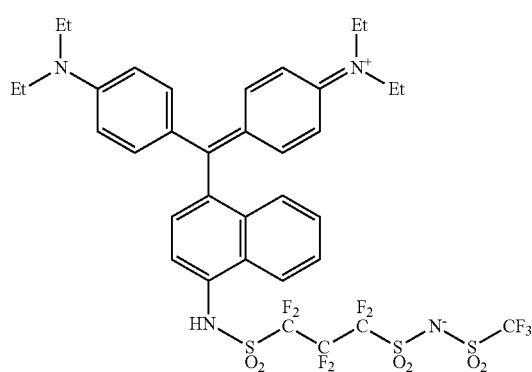

-continued
I-103
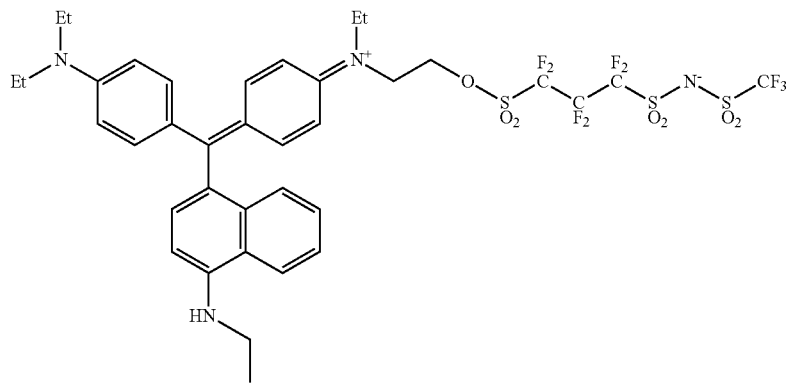
I-104
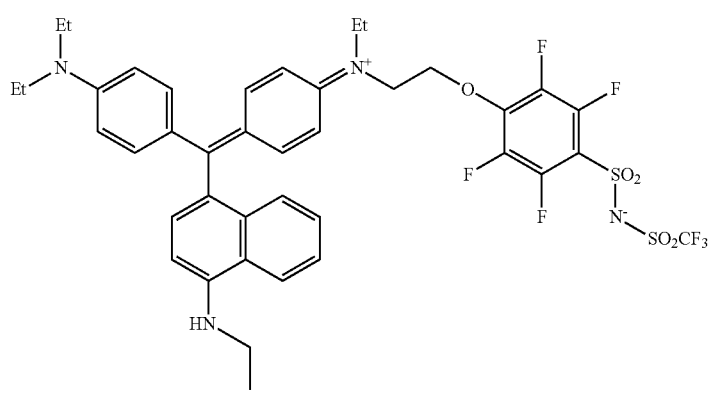
I-105
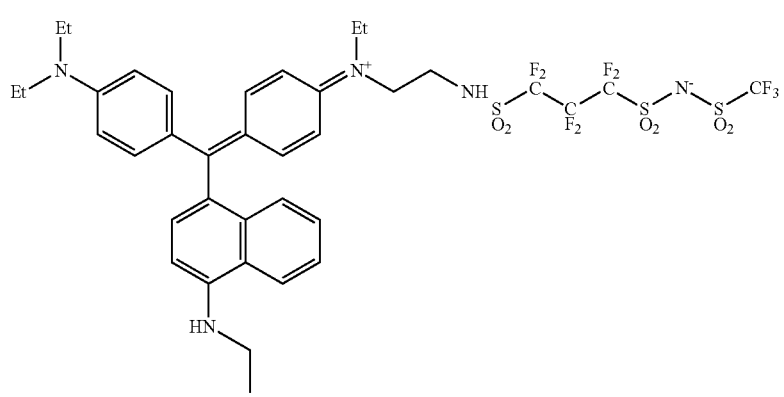
I-106
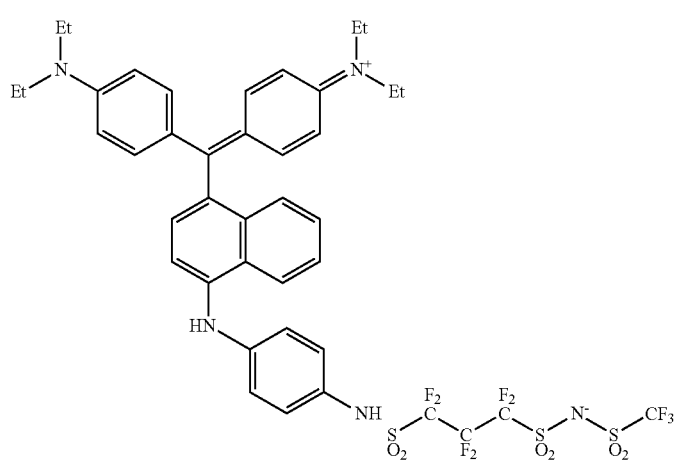

-continued
I-107
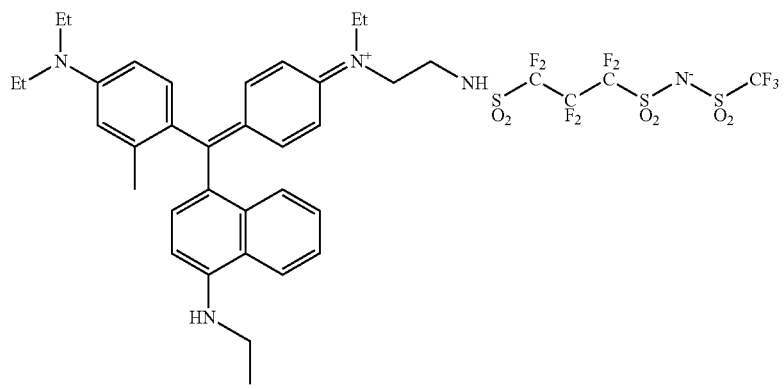
I-108
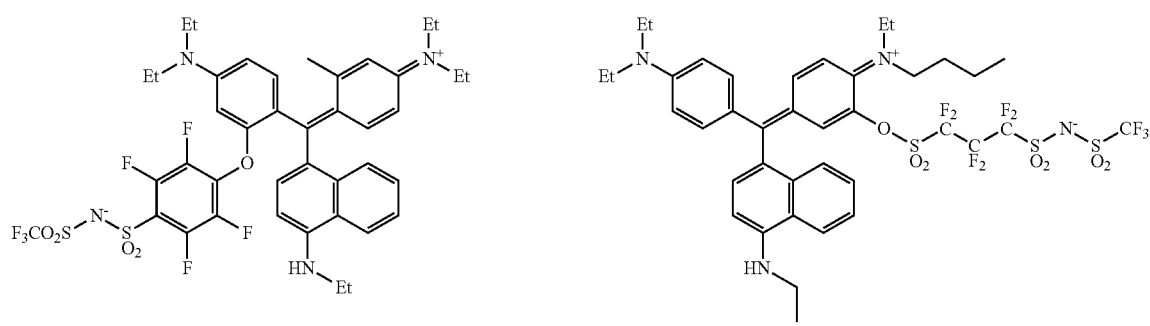
I-109
I-110
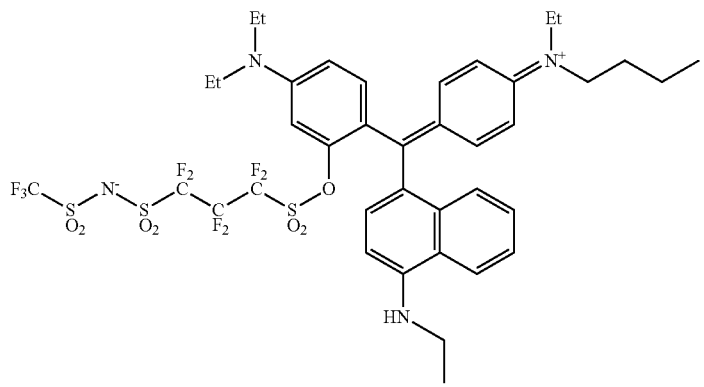
I-111
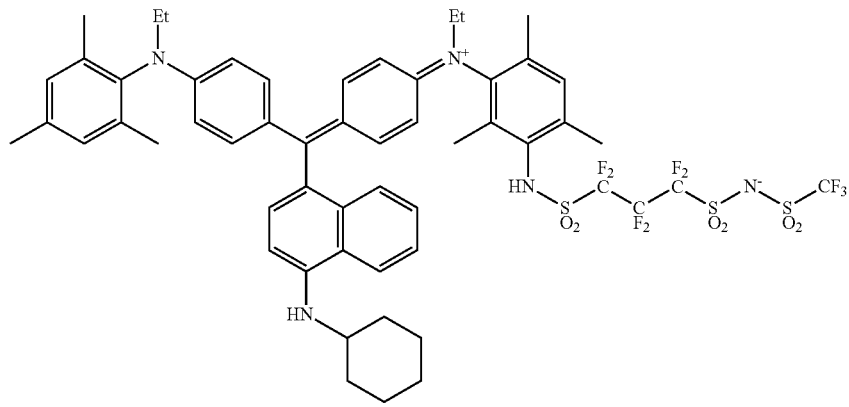

-continued

I-112

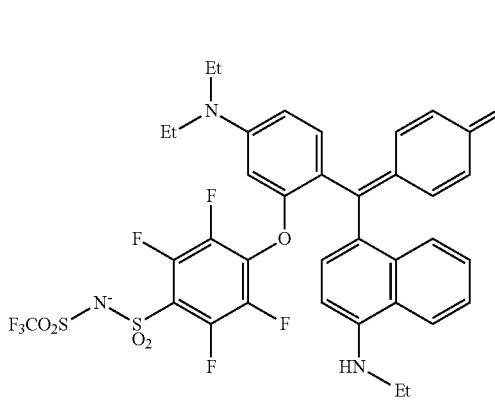

I-113

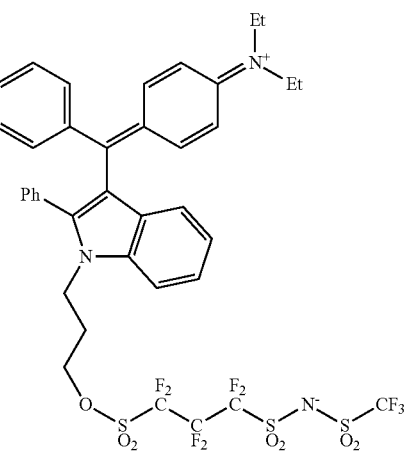

I-114

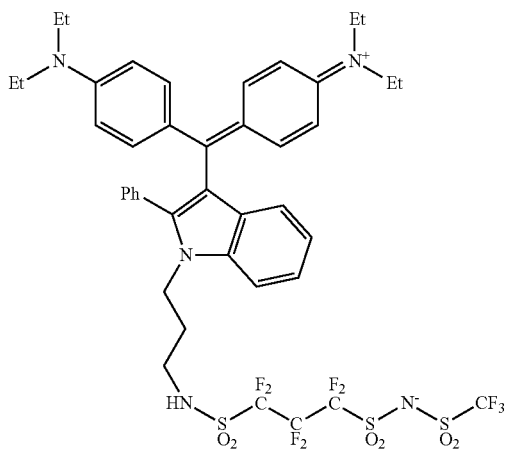

A method for synthesizing the triarylmethane compound having a structure represented by General Formula (1) and a structure represented by General Formula (2) in the same molecule is not particularly limited and the triarylmethane compound can be synthesized by a known method. Specifically, the triarylmethane compound can be synthesized by the method described in WO2009-107734A or by condensation of benzophenones with aniline, naphthylamino, or indole.

The content of the triarylmethane compound having a structure represented by General Formula (1) and a structure represented by General Formula (2) in the same molecule in the curable coloring composition is preferably 1% by mass to 40% by mass, and more preferably 5% by mass to 20% by mass, with respect to the total solid content of the curable coloring composition. By setting the range, the heat resistance, the solvent resistance, and the voltage holding ratio can be improved.

[Coloring Compound]

Furthermore, the curable coloring composition of the present invention may further include dye compounds of other structures or pigment compounds, and dispersions thereof. These compounds may be included in the amount of 1% by mass or less with respect to the total color materials. The dye compounds may have any structure that does not affect the hue of the colored image and examples thereof include azo-based dyes (for example, Solvent Yellow 162), anthraquinone-based dyes (for example, the anthraquinone compounds described in JP2001-10881A), phthalocyanine-based dyes (for example, the phthalocyanine compounds described in US2008/0076044A1), xanthene-based dyes (for example, C. I. Acid Red 289), triarylmethane-based dyes (for example, C. I. Acid Blue 7, C. I. Acid Blue 83, C. I. Acid Blue 90, C. I. Solvent Blue 38, C. I. Acid Violet 17, C. I. Acid Violet 49, and C. I. Acid Green 3), and methine dyes.

[Pigment Compound]

Examples of the pigment compounds include perylene, perinone, quinacridone, quinacridone quinone, anthraquinone, anthanthrone, benzimidazolone, disazo condensation, disazo, azo, indanthrone, phthalocyanine, triaryl carbonium, dioxazine, aminoanthraquinone, diketopyrrolopyrrole, indigo, thioindigo, isoindoline, isoindolinone, pyranthrone, and isoviolanthrone. More specific examples thereof include perylene compound pigments such as Pigment Red 190, Pigment Red 224, and Pigment Violet 29; perinone compound pigments such as Pigment Orange 43 and Pigment Red 194; quinacridone compound pigments such as Pigment Violet 19, Pigment Violet 42, Pigment Red 122, Pigment Red 192, Pigment Red 202, Pigment Red 207, and Pigment Red 209; quinacridone quinone compound pigments such as Pigment Red 206, Pigment Orange 48, and Pigment Orange 49; anthraquinone compound pigments such as Pigment Yellow 147; anthanthrone compound pigments such as Pigment Red 168; benzimidazolone compound pigments such as Pigment Brown 25, Pigment Violet 32, Pigment Orange 36, Pigment Yellow 120, Pigment Yellow 180, Pigment Yellow 181, Pigment Orange 62, and Pigment Red 185; disazo condensation compound pigments such as Pigment Yellow 93, Pigment Yellow 94, Pigment Yellow 95, Pigment Yellow 128, Pigment Yellow 166, Pigment Orange 34, Pigment Orange 13, Pigment Orange 31, Pigment Red 144, Pigment Red 166, Pigment Red 220, Pigment Red 221, Pigment Red 242, Pigment Red 248, Pigment Red 262, and Pigment Brown 23; disazo compound pigments such as Pigment Yellow 13, Pigment Yellow 83, and Pigment Yellow 188; azo compound pigments such as Pigment Red 187, Pigment Red 170, Pigment Yellow 74, Pigment Yellow 150, Pigment Red 48, Pigment Red 53, Pigment Orange 64, and Pigment Red 247; indanthrone compound pigments such as Pigment Blue 60; phthalocyanine compound pigments such as Pigment Green 7, Pigment Green 36, Pigment Green 37, Pigment Green 58, Pigment Blue 16, Pigment Blue 75, and Pigment Blue 15; triaryl carbonium compound pigments such as Pigment Blue 56, and Pigment Blue 61; dioxazine compound pigments such as Pigment Violet 23, and Pigment Violet 37; aminoanthraquinone compound pigments such as Pigment Red 177; diketopyrrolopyrrole compound pigments such as Pigment Red 254, Pigment Red 255, Pigment Red 264, Pigment Red 272, Pigment Orange 71, and Pigment Orange 73; thioindigo compound pigments such as Pigment Red 88; isoindoline compound pigments such as Pigment Yellow 139 and Pigment Orange 66; isoindolinone compound pigments such as Pigment Yellow 109 and Pigment Orange 61; pyranthrone compound pigments such as Pigment Orange 40 and Pigment Red 216; and isoviolanthrone compound pigments such as Pigment Violet 31.

In the present invention, color materials in green to cyan preferable, and phthalocyanine compound pigments such as Pigment Green 7, Pigment Green 36, Pigment Green 37, Pigment Green 58, Pigment Blue 16, Pigment Blue 75, and Pigment Blue 15; triarylcarbonium compound pigments such as Pigment Blue 56, and Pigment Blue 61; dioxazine compound pigments such as Pigment Violet 23 and Pigment Violet 37; aminoanthraquinone compound pigments such as Pigment Red 177; diketopyrrolopyrrole compound pigments Pigment Red 254, Pigment Red 255, Pigment Red 264, Pigment Red 272, Pigment Orange 71, and Pigment Orange 73; thioindigo compound pigments such as Pigment Red 88; isoindoline compound pigments such as Pigment Yellow 139 and Pigment Orange 66; isoindolinone compound pigments such as Pigment Yellow 109 and Pigment Orange 61; pyranthrone compound pigments such as Pigment Orange 40 and Pigment Red 216; and isoviolanthrone compound pigments such as Pigment Violet 31.

In the case of incorporating the dyes or pigments as dispersions, they can be prepared as described in JP1997-197118A (JP-H09-197118A) and JP2000-239544A.

The dyes and pigments can be used at any content that does not interfere with the effects of the present invention, but the content is preferably 0.5% by mass to 70% by mass with respect to the total solid content of the curable coloring composition of the present invention. Further, the dyes and pigments are preferably added to the curable coloring composition such that the absorption strength ratio (absorption at 450 nm/absorption at 650 nm) is in the range of 0.95 to 1.05. The amount of the compounds other the triarylmethane compound having a structure represented by General Formula (1) and a structure represented by General Formula (2) in the same molecule is preferably 30% by mass or less, more preferably 15% by mass or less, and still more preferably 10% by mass or less, with respect to all the colorant compounds.

<<Polymerizing Compound>>

The curable coloring composition of the present invention preferably includes at least one kind of polymerizing compound. Examples of the polymerizing compound include addition-polymerizing compounds having at least one ethylenically unsaturated double bond.

Specifically, the polymerizing compound is selected from the compounds having at least one ethylenically unsaturated bond, or two or more ethylenically unsaturated bonds at terminals. Such compound groups are widely known in the industrial field of the relevant art and can be used in the present invention without particular limitation. These may be in any type of chemical forms such as a monomer, a prepolymer, that is, a dimer, a trimer, an oligomer, a mixture thereof, and an oligomer thereof. With regard to specific examples of the polymerizing compound, reference can be made to the description in paragraphs "0042" to "0049" of JP2013-182215A, the contents of which can be incorporated herein.

As the polymerizing compound, a commercially available product may be used. Examples thereof include KARAYAD DPHA (manufactured by Nippon Kayaku Co., Ltd, a mixture of dipentaerythritol pentaacrylate and dipentaerythritol hexaacrylate).

In the case where the curable coloring composition has a polymerizing compound, the content of the polymerizing compound in the total solid content of the curable coloring composition (the total content in the case where two or more kinds of the polymerizing compound are used) is not particularly limited, and from the viewpoint of effectively obtaining the effects of the present invention, the content is preferably 10% by mass to 80% by mass, more preferably 15% by mass to 75% by mass, and particularly more preferably 20% by mass to 60% by mass. One kind or two or more kinds of polymerizing compound may be used. In the case of using two or more kinds of polymerizing compound, the total sum is preferably in the above range.

<<Photopolymerization Initiator>>

The curable coloring composition of the present invention preferably includes at least one kind of photopolymerization initiator. The photopolymerization initiator is not particularly limited as long as it is obtained by polymerization of the polymerizing compound, and it is preferably selected from the viewpoints of the features, initiation efficiency, absorption wavelength, availability, cost, and the like.

Examples of the photopolymerization initiator include at least one active halogen compound selected from a halomethyl oxadiazole compound and a halomethyl-s-triazine compound, 3-aryl-substituted coumarin compounds, lophine dimers, benzophenone compounds, acetophenone compounds and derivatives thereof, cyclopentadiene-benzene-iron complexes and salts thereof, and oxime compounds. Specific examples of the photopolymerization initiators include those described in paragraphs "0070" to "0077" of JP2004-295116A. Among these, oxime compounds or biimidazole-based compounds are preferable from the viewpoints of a rapid polymerization reaction and the like.

The oxime-based compound (hereinafter also referred to as an "oxime-based photopolymerization initiator") is not particularly limited and examples thereof include the oxime-based compounds described in JP2000-80068A, WO02/100903A1, and JP2001-233842A.

With regard to specific examples of the oxime-based compound, reference can be made to the description in paragraph "0053" of JP2013-182215A, the contents of which are incorporated herein.

Moreover, in the present invention, the oxime compound is more preferably a compound represented by the following General Formula (1a) or General Formula (2a) from the viewpoints of sensitivity, stability over time, and discoloration during post-heating.

General Formula (1a)

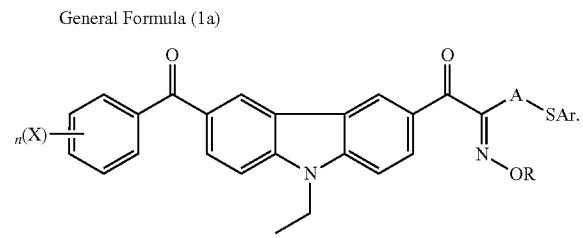

(in General Formula (1a), R and X each represent a monovalent substituent, A represents a divalent organic group, Ar represents an aryl group, and n represents an integer of 1 to 5)

As R, an acyl group is preferable, and specifically, an acetyl group, a propionyl group, a benzoyl group, and a toluyl group are preferable, from the viewpoint of obtaining high sensitivity.

From the viewpoint of increasing sensitivity and suppressing coloration due to heating over time, A is preferably an unsubstituted alkylene group, an alkylene group substituted by an alkyl group (for example, a methyl group, an ethyl group, a tert-butyl group, and a dodecyl group), an alkylene group substituted by an alkenyl group (for example, a vinyl group and an allyl group), or an alkylene group substituted by an aryl group (for example, a phenyl group, a p-tolyl group, a xylyl group, a cumenyl group, a naphthyl group, an anthryl group, a phenanthryl group, and a styryl group).

From the viewpoint of increasing sensitivity and suppressing coloration due to heating over time, Ar is preferably a substituted or unsubstituted phenyl group. In the case where the phenyl group is substituted, the substituent is preferably a halogen group such as a fluorine atom, a chlorine atom, a bromine atom, and an iodine atom.

From the viewpoint of improving solubility in a solvent and absorption efficiency at a longer wavelength range, X is preferably an alkyl group which may have a substituent, an aryl group which may have a substituent, an alkenyl group which may have a substituent, an alkynyl group which may have a substituent, an alkoxy group which may have a substituent, an aryloxy group which may have a substituent, an alkylthioxy group which may have a substituent, an arylthioxy group which may have a substituent, or an amino group which may have a substituent. Further, n in General Formula (1) is preferably an integer of 1 to 2.

General Formula (2a)

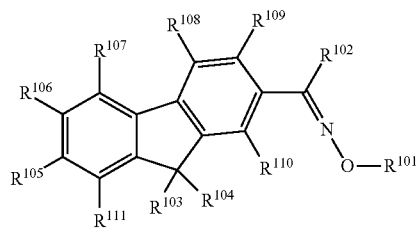

In General Formula (2a), $R^{101}$ represents an alkyl group, an alkanoyl group, an alkenoyl group, an aryloyl group, an alkoxycarbonyl group, an aryloxycarbonyl group, a heterocyclic oxycarbonyl group, a heteroaryloxycarbonyl group, an alkylthiocarbonyl group, an arylthiocarbonyl group, a heterocyclic thiocarbonyl group, a heteroarylthiocarbonyl group, or —CO—CO—Rf. Rf represents a carbocyclic aromatic ring or a heterocyclic aromatic ring.

$R^{102}$ represents an alkyl group, an aryl group, or a heterocyclic group, and these may be substituted.

$R^{103}$ and $R^{104}$ each independently represent an alkyl group, an aryl group, or a heterocyclic group, and these may further be substituted with a halogen atom, an alkyl group, an aryl group, an alkoxy group, an alkylcarbonyl group, or the like.

$R^{105}$ to $R^{111}$ each independently represent a hydrogen atom, a halogen atom, an alkyl group, an aryl group, a heterocyclic group, an alkoxy group, an aryloyl group, a heteroaryloyl group, an alkylthio group, an aryloylthio group, a heteroaryloyl group, an alkylcarbonyl group, an arylcarbonyl group, a heteroarylcarbonyl group, an alkoxycarbonyl group, an aryloxycarbonyl group, a heterocyclic oxycarbonyl group, a nitro group, an amino group, a sulfonic acid group, a hydroxy group, a carboxylic acid group, an amide group, a carbamoyl group, or a cyano group.

It is preferable that one or two members out of $R^{105}$ to $R^{111}$ are an electron-withdrawing substituent, that is, a nitro group, a cyano group, a halogeno group, an alkylcarbonyl group, or an arylcarbonyl group since a curable coloring composition having higher curability is obtained.

Specific examples of the compound having a fluorene structure represented by General Formula (2a) are shown below, but are not limited to these compounds. Ac represents an acetyl group.

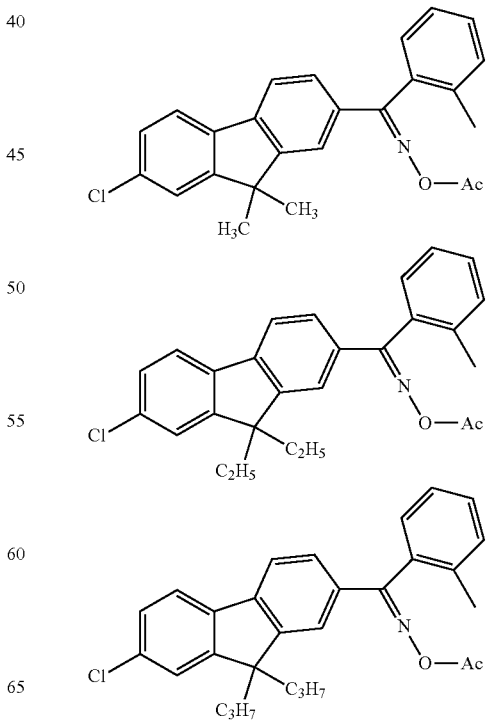

-continued

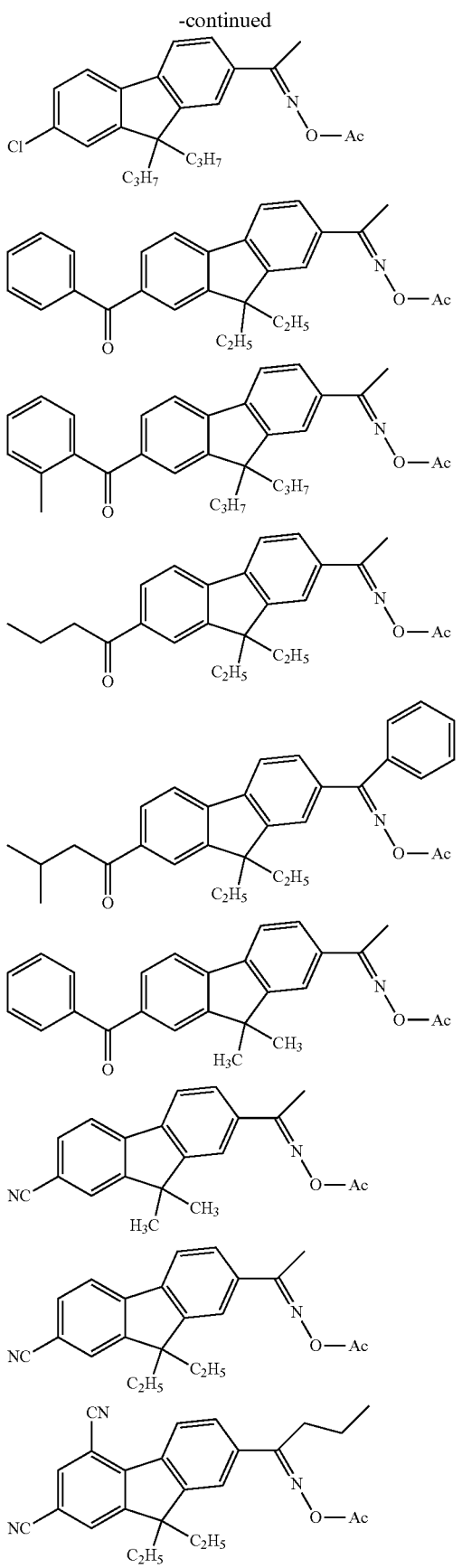

The compound having the fluorene structure represented by General Formula (2a) can be synthesized in accordance with, for example, the synthesis method described in WO2014-050738A.

With regard to specific examples of the biimidazole-based compound, reference can be made to descriptions in paragraphs "0061" to "0070" of JP2013-182213A, the contents of which are incorporated herein.

Furthermore, for the curable coloring composition of the present invention, other known photopolymerization initiators described in paragraph No. "0079" of JP2004-295116A may be used, in addition to the photopolymerization initiator.

In the case where the curable coloring composition has a photopolymerization initiator, the content of the photopolymerization initiator (in the case where two or more kinds of photopolymerization initiator are used, the total content thereof) is preferably 3% by mass to 20% by mass, more preferably 4% by mass to 19% by mass, and particularly preferably 5% by mass to 18% by mass, with respect to the total solid content of the curable coloring composition, from the viewpoint of effectively obtaining the effects of the present invention. One kind or two or more kinds of the photopolymerization initiator may be used. In the case where two or more kinds of the photopolymerization initiator are used, the total sum thereof is preferably within the above range.

<<Organic Solvent>>

The curable coloring composition of the present invention can include at least one kind of organic solvent.

Basically, the organic solvent is not particularly limited as long as the solubility of the respective components or the coatability when forming into a curable coloring composition, and in particular, it is preferably selected in consideration of the solubility, the coatability, and the safety of a binder.

As the organic solvent, esters, ethers, ketones, or aromatic hydrocarbons are used, and specific examples thereof include those described in paragraph Nos. "0161" and "0162" of JP2012-032754A.

From the solubility of the respective components; in the case of including the alkali-soluble polymer, the solubility of the alkali-soluble polymer; and the improvement of the coated surface conditions, the organic solvents may be used as a mixture of two or more kinds thereof. In this case, a mixed solution composed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether acetate, and propylene glycol monomethyl ether acetate is particularly preferable.

In the case where the curable coloring composition has an organic solvent, the content of the organic solvent in the curable coloring composition is an amount such that the total solid concentration in the composition preferably becomes 10% by mass to 80% by mass, and more preferably becomes 15% by mass to 60% by mass. One kind or two or more kinds of the organic solvent may be used. In the case where two or more kinds of the organic solvent are used, the total sum thereof is preferably within the above range.

<<Alkali-Soluble Binder>>

The curable coloring composition of the present invention preferably includes an alkali-soluble binder. The alkali-soluble binder is not particularly limited as long as it is alkali-soluble, and it can be preferably selected from the viewpoints of heat resistance, developability, availability, and the like.

A preferred alkali-soluble binder is a high-molecular weight organic linear polymer, which is soluble in an organic solvent and developable with a weakly alkaline aqueous solution. Examples of such a high-molecular weight organic linear polymer include polymers having a carboxylic acid in the side chain, such as the methacrylic acid copolymers, the acrylic acid copolymers, the itaconic acid copolymers, the crotonic acid copolymers, the maleic acid copolymers, the partially esterified maleic acid copolymers, and the like, described in JP1984-44615A (JP-S59-44615A), JP1979-34327B (JP-S54-34327B), JP1983-12577B (JP-S58-12577B), JP1979-25957B (JP-S54-25957B), JP1984-53836A (JP-S59-53836A), and JP1984-71048A (JP-S59-71048A), as well as acidic cellulose derivatives having a carboxylic acid in the side chain.

In addition to those described above, with regard to the alkali-soluble binder in the present invention, reference can be made to the description in paragraphs "0079" to "0082" of JP2013-182215A, the contents of which are incorporated herein.

Moreover, copolymers of maleimide and ethylene oxide, as represented by Structural Formulae b1 and b2 can also be preferably used.

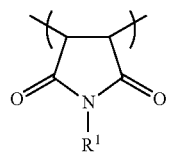

(b1)

In General Formula (b1), $R^1$ represents a hydrogen atom, an aryl group, or an alkyl group.

In the case where $R^1$ represents an alkyl group, examples of the alkyl group include a linear alkyl group having 1 to 10 carbon atoms, a branched alkyl group having 3 to 10 carbon atoms, and a cyclic alkyl group having carbon atoms 5 to 20, and more specifically a methyl group, an ethyl group, a t-butyl group, and a cyclohexyl group.

The alkyl group may further include a substituent, and examples of the substituent which may be introduced into the alkyl group include a phenyl group, a carbonyl group, an alkoxy group, a hydroxy group, and an amino group.

In the case where $R^1$ represents an aryl group, examples of the aryl group include an aryl group having a monocyclic structure, an aryl group having a polycyclic structure, an aryl group having a condensed structure, and heteroaryl group having a hetero atom. More specific examples thereof include a phenyl group, a naphthyl group, a biphenyl group, a benzoimidazolyl group, a pyridyl group, and a furyl group.

The aryl group may further include a substituent, and examples of the substituent which may be introduced into the aryl group include alkyl groups such as a methyl group, an ethyl group, a t-butyl group, and a cyclohexyl group, alkoxy groups such as a methoxy group, a carboxy group, a hydroxy group, an amino group, a nitro group, a chloro group, and a bromo group.

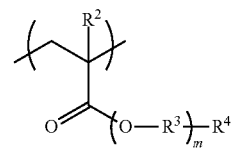

(b2)

In General Formula (b2), $R^2$ represents a hydrogen atom or a methyl group. $R^3$ represents an alkylene group having 2 or 3 carbon atoms, $R^4$ represents a hydrogen atom, an aryl group, or an alkyl group, and m represents an integer of 1 to 15.

In the case where $R^4$ represents an alkyl group, examples of the alkyl group include a linear alkyl group having 1 to 20 carbon atoms, a branched alkyl group having 1 to 20 carbon atoms, and a cyclic alkyl group having carbon atoms 5 to 20, and more specifically a methyl group, an ethyl group, a t-butyl group, a cyclohexyl group, and a 2-ethylhexyl group.

The alkyl group may further include a substituent, and examples of the substituent which may be introduced into the alkyl group include a phenyl group, a carbonyl group, and an alkoxy group.

In the case where $R^4$ represents an aryl group, examples of the aryl group include an aryl group having a monocyclic structure, an aryl group having a polycyclic structure, an aryl group having a condensed structure, and heteroaryl group having a hetero atom. More specific examples thereof include a phenyl group, a naphthyl group, an anthranyl group, a biphenyl group, a benzoimidazolyl group, an indolyl group, an imidazolyl group, an oxazolyl group, a carbazolyl group, a pyridyl group, and a furyl group.

The aryl group may further include a substituent, and examples of the substituent which may be introduced into the aryl group include a nonyl group, alkyl groups such as a methyl group, an ethyl group, a t-butyl group, and a cyclohexyl group, alkoxy groups such as a methoxy group, a carboxy group, a hydroxy group, an amino group, a nitro group, a chloro group, and a bromo group.

Furthermore, in order to improve the crosslinking efficiency, the alkali-soluble binder may have a polymerizable group in the side chain, and polymers containing, for example, an allyl group, a (meth)acryl group, an allyloxyalkyl group, or the like in the side chain are also useful. Examples of the polymer containing a polymerizable group include KS RESIST-106 manufactured by Osaka Organic Chemical Industry Ltd.) and CYCLOMER P series (manufactured by Daicel Company Ltd.), which are commercially available products. In addition, in order to enhance the strength of a cured film, alcohol-soluble nylon, polyether formed of 2,2-bis-(4-hydroxyphenyl)-propane and epichlorohydrin, and the like are also useful.

Among various alkali-soluble binders above, from the viewpoint of heat resistance, a polyhydroxystyrene-based resin, a polysiloxane-based resin, an acrylic resin, an acrylamide-based resin, and an acryl/acrylamide copolymer resin are preferable, and from the viewpoint of controlling developability, an acryl-based resin, an acrylamide-based resin, and an acryl/acrylamide copolymer resin are preferred.

Among these, a copolymer having a repeating unit as represented by the following General Formula (2b) and an acidic group is preferable, and more preferred examples of the copolymer include a copolymer having a repeating unit represented by the following General Formula (3b), in addition to General Formula (2b) and the acidic group.

General Formula (2b)

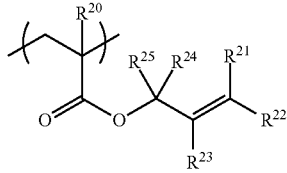

In General Formula (2b), $R^{20}$ represents a hydrogen atom or a methyl group, and $R^{21}$, $R^{22}$, $R^{23}$, $R^{24}$, and $R^{25}$ each independently represent a hydrogen atom, a halogen atom, a cyano group, an alkyl group, or an aryl group.

General Formula (3b)

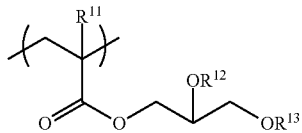

In General Formula (3b), $R^{11}$ represents a hydrogen atom or a methyl group. $R^{12}$ and $R^{13}$ each independently represent a hydrogen atom or a carbonyl group having 3 to 20 carbon atoms having an unsaturated double bond as a partial structure, and both of $R^{12}$ and $R^{13}$ are hydrogen atoms in no case. In the case where at least one of $R^{12}$ and $R^{13}$ represents a carbonyl group having 3 to 20 carbon atoms having an unsaturated double bond as a partial structure, it may further contain a carboxy group as a partial structure.

As the acryl-based resin, a copolymer formed of monomers selected from benzyl (meth)acrylate, (meth)acrylic acid, hydroxyethyl (meth)acrylate, and (meth)acrylamide, KS RESIST-106 (manufactured by Osaka Organic Chemical Industry Ltd.), CYCLOMER P Series (manufactured by Daicel Chemical Industries, Ltd.), and the like which are commercially available are preferable. Further, a copolymer of benzyl methacrylate/methacrylic acid (85/15 [mass ratio]) is also preferable.

Furthermore, the alkali-soluble binder may include a structural unit derived from an ethylenically unsaturated monomer represented by the following Formula (X).

General Formula (X)

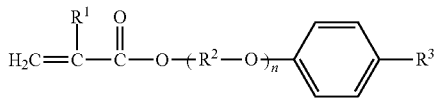

(in Formula (X), $R^1$ represents a hydrogen atom or a methyl group, $R^2$ represents an alkylene group having 2 to 10 carbon atoms, $R^3$ represents a hydrogen atom or an alkyl group having 1 to 20 carbon atoms, which may contain a benzene ring, and n represents an integer of 1 to 15)

In Formula (X), the alkylene group of $R^2$ preferably has 2 to 3 carbon atoms. Further, the alkyl group of $R^3$ has 1 to 20 carbon atoms, and more preferably 1 to 10 carbon atoms, and the alkyl group of $R^3$ may contain a benzene ring.

Examples of the alkyl group containing a benzene ring, represented by $R^3$, include a benzyl group and a 2-phenyl (iso)propyl group.

The alkali-soluble binder is preferably a polymer having a weight average molecular weight (a value in terms of polystyrene as measured by a GPC method) of 1,000 to $2\times10^5$, more preferably 2,000 to $1\times10^5$, and particularly preferably 5,000 to $5\times10^4$ from the viewpoints of developability, liquid viscosity, and the like.

In the case where the curable coloring composition has an alkali-soluble binder, the blending amount of the alkali-soluble binder is preferably 10% by mass to 80% by mass, and more preferably 20% by mass to 60% by mass, with respect to the total solid content. Further, the acid value of the binder is preferably 10 mg/KOH to 1000 mg/KOH, among which the acid value of 50 mg/KOH to 300 mg/KOH is more preferable, and the acid value of 50 mg/KOH to 200 mg/KOH is still more preferable.

One kind or two or more kinds of the alkali-soluble binder may be used. In the case where two or more kinds of the alkali-soluble binder are used, the total sum thereof is preferably within the above range.

<<Crosslinking Agent>>

It is also possible to further improve the hardness of the cured film obtained by curing the curable coloring composition by using a crosslinking agent complementarily in the curable coloring composition of the present invention.

The crosslinking agent is not particularly limited as long as it makes it possible to cure a film by a crosslinking reaction, and examples thereof include (a) an epoxy resin, (b) a melamine compound, a guanamine compound, a glycoluril compound, or a urea compound substituted with at least one substituent selected from a methylol group, an alkoxymethyl group, and an acyloxymethyl group, and (c) a phenol compound, a naphthol compound, or a hydroxyanthracene compound, which is substituted with at least one substituent selected from a methylol group, an alkoxymethyl group, and an acyloxymethyl group. Among these, a polyfunctional epoxy resin is preferable.

With regard to details of specific examples and the like of the crosslinking agent, reference can be made to the description in paragraph Nos. "0134" to "0147" of JP2004-295116A.

In the case where the curable coloring composition has a crosslinking agent, the blending amount of the crosslinking agent is preferably 5% by mass to 50% by mass, more preferably 10% by mass to 40% by mass, and still more preferably 15% by mass to 30% by mass, with respect to the total solid contents of the composition. One kind or two or more kinds of the crosslinking agent may be used. In the case where two or more kinds of the crosslinking agent are used, the total sum thereof is preferably within the above range.

<<Surfactant>>

The curable coloring composition of the present invention may include a surfactant. The surfactant may be any one of a non-ionic surfactant, a cationic surfactant, and an anionic surfactant, but a surfactant having an ethylene oxide structure and a fluorine-containing surfactant is preferable. In particular, a surfactant having an ethylene oxide structure, which has an HLB value in the range of 9.2 to 15.5, or the fluorine-containing surfactant described in JP1990-54202A (JP-H02-54202A) is preferable.

As a commercially available product, Megaface F781-F (manufactured by DIC Corporation) or the like can be used.

In the case where the curable coloring composition has a surfactant, the blending amount of the surfactant is preferably 0.0001% by mass to 5% by mass, more preferably 0.001% by mass to 3% by mass, and still more preferably 0.01% by mass to 1% by mass, with respect to the total solid content. One kind or two or more kinds of the surfactant may be used. In the case where two or more kinds of the surfactant are used, the total sum thereof is preferably within the above range.

<<Dye Stabilizer>>

In the present invention, it is preferable to add a dye stabilizer, in addition to the triarylmethane compound. As the stabilizer, for example, a cationic stabilizer, an anionic stabilizer, a nonionic stabilizer, an amphoteric stabilizer, a silicone-based stabilizer, a fluorine-based surfactant, or the like can be used. Among the surfactants, a high-molecular surfactant (a high molecular weight dispersant) is preferable since it can provide uniform and fine dispersion.

Examples of the high molecular weight dispersant include (co)polymers of unsaturated carboxylic esters such as polyacrylic esters; (partial) amine salts, (partial) ammonium salts, or (partial) alkylamine salts of (co)polymers of unsaturated carboxylic acids such as polyacrylic acids; (co)polymers of hydroxyl group-containing unsaturated carboxylic esters such as hydroxyl group-containing polyacrylic esters, or combinations thereof; and polymerization products of sulfonic acid or phosphoric acid having a crosslinking group.

As the crosslinking group, known polymerizable groups which can be crosslinked by a radical, an acid, or heat can be used. Specific examples thereof include a (meth)acryl group, a styrene group, a vinyl group, a cyclic ether group, and a methylol group, but a (meth)acryl group, a styrene group, and a vinyl group are preferable, and a (meth)acryl group and a styrene group are more preferable.

In addition, in addition to these surfactants, it is also effective to add bistrifluoromethanesulfonimide sodium salts or salts (sodium salts, potassium salts, or the like) of the following anions.

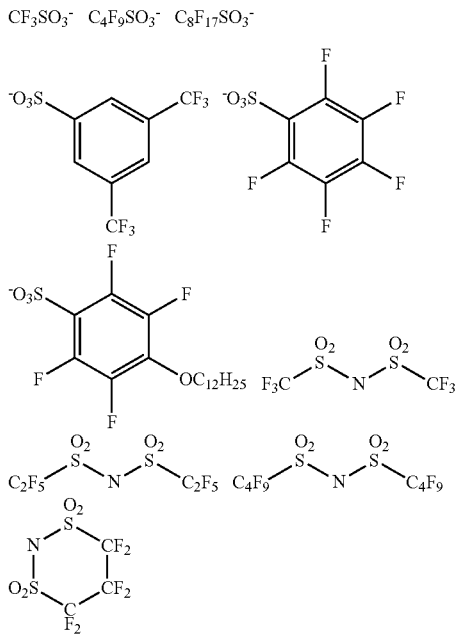

In the case where the curable coloring composition has a dye stabilizer, the blending amount of the dye stabilizer is preferably 1% by mass to 10% by mass, more preferably 1% by mass to 7% by mass, an still more preferably 3% by mass to 5% by mass, with respect to the total solid content. One kind or two or more kinds of the dye stabilizer may be used. In the case where two or more kinds of the dye stabilizer are used, the total sum thereof is preferably within the above range.

<<Antioxidant>>

It is preferable that at least one of a plurality of colored pixels constituting the color filter of the present invention contains an antioxidant. The antioxidant is not particularly limited, and examples thereof include a radical scavenger, a peroxide decomposer, an ultraviolet absorber, and a singlet oxygen quencher.

Examples of the radical scavenger include a phenol-based antioxidant and a hindered amine-based antioxidant. Examples of the phenol-based antioxidant include a hydroxyphenylpropionate-based compound, a hydroxybenzyl-based compound, a thiobisphenol-based compound, a thiomethylphenol-based compound, and an alkanediyl phenol-based compound. Among these, from the viewpoint of the stability of the color characteristics, a hydroxyphenyl propionate-based compound is preferable.

The peroxide decomposer is a compound which decomposes peroxides generated by exposure to light or the like into harmless materials while not causing new radicals to be generated, and examples thereof include a phosphorus-based antioxidant and a sulfur-based antioxidant. Among these, a sulfur-based antioxidant is preferable from the viewpoint of the stability of color characteristics.

Examples of the ultraviolet absorber include a salicylic ester-based antioxidant and a benzophenone-based antioxidant.

The singlet oxygen quencher is a compound which can deactivate singlet oxygen by energy transfer from oxygen in a singlet state, and examples thereof include ethylenic compounds such as tetramethylethylene and cyclopentene, amines such as diethylamine, triethylamine, 1,4-diazabicyclooctane (DABCO), and N-ethylimidazole, condensed polycyclic aromatic compounds such as naphthalene which may be substituted, dimethylnaphthalene, dimethoxyanthracene, anthracene, and diphenylanthracene; and in addition to aromatic compounds such as 1,3-diphenylisobenzofuran, 1,2,3,4-tetraphenyl-1,3-cyclopentadiene, and pentaphenyl-cyclopentadiene, the compounds described as a singlet oxygen quencher in Harry H. wasserman, "Singlet Oxygen", Chapter 5, Academic Press (1979), Nicholas J. Turro, "Modern Molecular Photochemistry", Chapter 14, The Benjamin Cummings Publishing Co., Inc. (1978), and High Functional Chemicals for Color Photographic Photosensitive Materials, Chapter 7 (2002), published by CMC.

Other examples thereof include metal complexes having a compound containing a sulfur atom as a ligand. Examples of such a compound include transition metal chelate compounds of a nickel complex, a cobalt complex, a copper complex, a manganese complex, and a platinum complex, each of which has bisdithio-α-diketone, bisphenyldithiol, or thiobisphenol as a ligand.

Examples of the sulfur-based antioxidant include a thiopropionate-based compound and a mercaptobenzimidazole-based compound. Among these, a thiopropionate-based compound is preferable from the viewpoint of the stability of color characteristics.

In the present invention, the antioxidant may be used singly or as a mixture of two or more kinds thereof, and in the case where the curable coloring composition has an antioxidant, the content of the antioxidant is preferably 0.01 parts by mass to 20 parts by mass, and particularly preferably 0.1 parts by mass to 10 parts by mass, with respect to 100 parts mass of the colorant which will be described later. In this case, if the content of the antioxidant is too low, there is a concern that a desired effect is not obtained, whereas if the content is too high, there is a concern that curability may deteriorate.

<<Curing Agent>>

The curable coloring composition used for the production of the color filter of the present embodiment may include a compound which functions as a curing agent.

The curing agent is at least one compound selected from the group consisting of an aromatic amine compound, a tertiary amine compound, an amine salt, a phosphonium salt, an amidine salt, an amide compound, a thiol compound, a block isocyanate compound, and an imidazole ring-containing compound.

The curable coloring composition can realize low-temperature curing of a colored pattern by including a curing agent selected from the specific compound group. Further, the preservation stability of the curable coloring composition can also be improved.

In the case where the curable coloring composition has a curing agent, the blending amount of the curing agent is preferably 1% by mass to 20% by mass, more preferably 3% by mass to 15% by mass, and still more preferably 5% by mass to 10% by mass, with respect to the total solid content. One kind or two or more kinds of the curing agent may be used. In the case where two or more kinds of the curing agent are used, the total sum thereof is preferably within the above range.

<<Reduction Inhibitor>>

In the present invention, for the purpose of inhibiting dye reduction discoloration during the ITO sputtering of pixel formation, a compound which is more likely to be reduced than a dye can be added as a reduction inhibitor of a dye. Specifically, a quinone compound is preferable, and a quinone compound having a structure having a molecular weight of about 100 to 800 is preferable.

In the case where the curable coloring composition has a reduction inhibitor, the blending amount of the reduction inhibitor is preferably 1% by mass to 20% by mass, more preferably 3% by mass to 15% by mass, and still more preferably 3% by mass to 10% by mass, with respect to the total solid content. One kind or two or more kinds of the reduction inhibitor may be used. In the case where two or more kinds of the reduction inhibitor are used, the total sum thereof is preferably within the above range.

<<Other Components>>

The curable coloring composition of the present invention may further include various additives such as a filler, an ultraviolet absorber, an aggregation inhibitor, a sensitizer, and a light stabilizer, if desired.

<Method for Preparing Curable Coloring Composition>

The curable coloring composition of the present invention is prepared by mixing the respective components with optional components, if desired.

Furthermore, in the preparation of the curable coloring composition, the respective components constituting the curable coloring composition may be blended at once or the respective components may be dissolved/dispersed in solvents and then sequentially blended. Further, the order of introduction and operating conditions during the blending are not particularly limited. For example, all the components may be dissolved/dispersed in a solvent simultaneously to prepare a composition, or if desired, two or more solutions/dispersions may be appropriately prepared from the respective components and mixed during the use (during the coating) to prepare a composition.

The curable coloring compositions prepared as described above can be provided for use after they are filtered off and separated through a filter preferably having a pore size of about 0.01 μm to 3.0 μm, more preferably 0.05 μm to 0.5 μm, or the like.

The curable coloring composition of the present invention can form a cured film having excellent hue and contrast so that they can be conveniently used for forming colored pixels in a color filter and the like used for liquid crystal display devices (LCDs) and solid-state image pickup elements (for example, a CCD and a CMOS) or for manufacturing an ink for printing, an ink for ink jet printing, a paint, and the like. In particular, the curable coloring composition is suitable for forming colored pixels for liquid crystal display devices.

<Color Filter and Method for Manufacturing Same>

The color filter of the present invention is formed of a substrate and a colored region including the curable coloring composition of the present invention on the substrate. The colored region on the substrate consists of colored films of, for example, red (R), green (G), blue (B) and the like, which form pixels in the color filter.

The color filter of the present invention may be formed by any method that allows formation of a cured colored region (colored pattern) by coating the curable coloring composition of the present invention onto the substrate. The color filter is preferably manufactured by using the curable coloring composition of the present invention.

Furthermore, in the case of manufacturing a color filter for a solid-state image pickup element by using the curable coloring composition of the present invention, the manufacturing method described in paragraphs "0359" to "0371" of JP2011-252065A can also be employed.

The method for manufacturing a color filter of the present invention includes a step (A) of coating the curable coloring composition as described above onto a substrate to form a colored layer (also referred to as a curable coloring composition layer), and a step (B) of curing the curable coloring composition layer formed in the step (A).

In the curing step, it is preferable that the curable coloring composition layer is patternwise exposed (preferably through a mask) and unexposed regions are removed by development using a developer to form a colored region (colored pattern). Through these four steps, a colored pattern consisting of pixels in the respective colors (three or four colors) is formed, whereby a color filter can be obtained. Further, in a preferred embodiment, the method for manufacturing a color filter of the present invention particularly further includes a step (C) of irradiating the colored pattern formed in the step (B) with ultraviolet rays and a step (D) of subjecting the colored pattern irradiated with ultraviolet rays in the step (C) to a heating treatment.

By using such a method, a color filter which is used in a liquid crystal display element or a solid-state image pickup element can be manufactured with little difficulty in the process, high quality, and low cost.

Hereinafter, the method for manufacturing a color filter of the present invention will be described in more detail.

—Step (A)—

In the method for manufacturing the color filter of the present invention, a curable coloring composition of the present invention as described above is first coated onto a substrate directly or via another layer by a desired coating method to form a coating layer of the curable coloring composition (curable coloring composition layer), and then precured (prebaked) as appropriate to dry the curable coloring composition layer.

Examples of the substrate include non-alkali glass, sodium glass, Pyrex (registered trademark) glass, quartz glass, and these glasses having a transparent conductive layer deposited thereon for use in liquid crystal display elements or the like, or substrates for photoelectric transducer elements for use in solid-state image pickup element and the like such as a silicone substrate and a plastic substrate. Further, on these substrates may be formed a black matrix separating pixels or a transparent resin layer to promote adhesion or for other purposes. Further, an undercoat layer may be provided on the substrate, if desired, to improve adhesion to the overlying layers or to prevent diffusion of substances or to smoothen the surface.

In addition, the plastic substrate preferably has a gas barrier layer and/or a solvent-resistant layer on the surface.

Alternatively, a driving substrate on which a thin-film transistor (TFT) for a thin-film transistor (TFT) color liquid crystal display device is mounted (hereinafter also referred to as a "driving substrate for TFT type liquid crystals") can be used as a substrate, and a colored pattern using the curable coloring composition of the present invention can also be formed on the driving substrate to manufacture a color filter.

Examples of the substrates in a driving substrate for TFT liquid crystals include glass, silicone, polycarbonate, polyester, aromatic polyamide, polyamideimide, and polyimide. These substrates may have undergone an appropriate pretreatment such as a chemical treatment with a silane coupling agent or the like, a plasma treatment, ion plating, sputtering, a gas phase reaction, and vacuum vapor deposition, if desired. For example, a driving substrate for TFT liquid crystals on which a passivation layer such as a silicon nitride film has been formed on the surface of the substrate can be used.

The curable coloring composition of the present invention is applied directly or via another layer on the substrate. As a method for applying the composition, coating is preferable, and the coating is preferably carried out using a coating method such as spin coating, slit coating, flow coating, roll coating, bar coating, and ink jet coating.

During the coating step, the method for coating the curable coloring composition of the present invention onto the substrate is not particularly limited, but it is preferably a method using a slit nozzle such as a slit/spin coating method, and a spinless coating method (hereinafter referred to as a slit nozzle coating method).

In the slit nozzle coating method, conditions for the slit/spin coating method and the spinless coating method depend on the size of the coating substrate, but in the case where a fifth generation glass substrate (1,100 mm×1,250 mm) is coated by a spinless coating method, for example, the rate at which a curable coloring composition is delivered from the slit nozzle is usually 500 μl/sec to 2,000 μl/sec, and preferably 800 μl/sec to 1,500 μl/sec, and the coating speed is typically 50 mm/sec to 300 mm/sec, and preferably 100 mm/sec to 200 mm/sec.

Further, the solid content of the curable coloring composition used in the coating step is typically 10% to 20%, and preferably 13% to 18%.

In the case where a coating film is formed on a substrate by using the curable coloring composition of the present invention, the thickness of the coating film (after the prebaking treatment) is generally 0.3 μm to 5.0 μm, preferably 0.5 μm to 4.0 μm, and most preferably 0.5 μm to 3.0 μm.

In addition, in the case of a color filter for a solid-state image pickup element, the thickness of the coating film (after the prebaking treatment) is preferably in the range of 0.5 um to 5.0 μm.

During the coating step, coating is typically followed by prebaking. If desired, prebaking may be preceded by a vacuum treatment. The conditions for vacuum drying typically include a degree of vacuum of about 0.1 torr to 1.0 torr, preferably about 0.2 torr to 0.5 torr.

Furthermore, prebaking can be carried out using a hot plate, an oven, or the like under conditions of a temperature range of 50° C. to 140° C., and preferably about 70° C. to 110° C. for 10 seconds to 300 seconds. Incidentally, the prebaking may be combined with a high-frequency wave treatment or the like. The high-frequency wave treatment can also be used alone.

Examples of the prebaking conditions include heating with a hot plate or an oven at 70° C. to 130° C. for about 0.5 minutes to 15 minutes.

Moreover, the thickness of the curable coloring composition layer formed with the curable coloring composition is appropriately selected according to the purposes. In the color filter for a liquid crystal display device, the thickness of the curable coloring composition layer is preferably in the range of 0.2 μm to 5.0 μm, more preferably in the range of 1.0 μm to 4.0 μm, and most preferably in the range of 1.5 μm to 3.5 μm. Further, in the color filter for a solid-state image pickup element, the thickness of the curable coloring composition layer is preferably in the range of 0.2 μm to 5.0 μm, more preferably in the range of 0.3 μm to 2.5 μm, and most preferably in the range of 0.3 μm to 1.5 μm.

Further, the film thickness of the curable coloring composition layer is a film thickness after prebaking.

—Step (B)—

Next, in the method for manufacturing a color filter of the present invention, a film including the curable coloring composition formed on the substrate as described above (curable coloring composition layer) is subjected to exposure through, for example, a photomask. As the light or radiation that can be applied for the exposure, a g-ray, an h-ray, an i-ray, a j-ray, a KrF light, or an ArF light is preferable, and an i-ray is particularly preferable. In the case where the i-ray is used for irradiation, it is preferably irradiated at an exposure dose of 100 mJ/cm$^2$ to 10,000 mJ/cm$^2$.

Furthermore, other exposure light sources include mercury lamps at an ultra-high pressure, a high pressure, a medium pressure, and a low pressure, chemical lamps, carbon arc lamps, xenon lamps, metal halide lamps, various visible light and ultraviolet laser light sources, fluorescent lamps, tungsten lamps, solar light, or the like can also be used.

Exposure Step Using Light Source

In the exposure method using a laser light source, an ultraviolet laser is used as a light source.

As irradiation light, an ultraviolet laser having a wavelength in the range of 300 nm to 380 nm is preferable, and an ultraviolet laser having a wavelength in the range of 300 nm to 360 nm is more preferable since it conforms to the photosensitive wavelength to which the resist is sensitive. Specifically, relatively inexpensive lasers with especially high output can be suitably used, including solid-state lasers such as the third harmonic generation (355 nm) of Nd:YAG laser or excimer lasers XeCl (308 nm) and XeF (353 nm)

The exposure dose of the target (pattern) is in the range of 1 mJ/cm$^2$ to 100 mJ/cm$^2$, and more preferably in the range of 1 mJ/cm$^2$ to 50 mJ/cm$^2$. The exposure doses in these ranges are preferable from the viewpoint of patterning productivity.

The exposure apparatus is not particularly limited, and commercial products such as Callisto (manufactured by V-Technology Co., Ltd.), EGIS (manufactured by V-Technology Co., Ltd.), DF2200G (manufactured by DAINIPPON SCREEN MFG. CO., LTD.), or the like can be used. Further, other apparatuses than those described above may also be suitably used.

When color filters for liquid crystal display devices are to be prepared, exposure primarily using an h-ray or an i-ray by a proximity exposure system or a mirror projection exposure system is preferably used. When color filters for solid-state image pickup elements are to be prepared, it is preferable to primarily use an i-ray in a stepper exposure system. Further, the photomask used for manufacturing a color filter using a driving substrate for TFT liquid crystals has a pattern for forming a pixel (colored pattern) as well as a pattern for forming a through-hole or a U-shaped groove.

The curable coloring composition layer exposed as described above can be heated.

In addition, exposure can also be carried out under a stream of nitrogen gas in the chamber to prevent oxidative discoloration of color materials in the coloring composition layer.

Next, the curable coloring composition layer after the exposure is subjected to development with a developer. Thus, a negative or positive colored pattern (resist pattern) can be formed. In the developing step, uncured regions of the exposed coating layer are dissolved in the developer while only cured regions remain on the substrate.

Any developer can be used so far as it dissolves the coating layer of the curable coloring composition (curable coloring composition layer) in uncured regions while it does not dissolve cured regions. For example, a combination of various organic solvents or an aqueous alkaline solution can be used.

Examples of the organic solvents used for development include those already described as solvents that can be used to prepare the curable coloring compositions of the present invention.

The aqueous alkaline solution includes, for example, an aqueous alkaline solution of an alkaline compound such as tetrapropylammonium hydroxide, tetrabutylammonium hydroxide, benzyltrimethylammonium hydroxide, sodium hydroxide, potassium hydroxide, sodium carbonate, sodium hydrogen carbonate, sodium silicate, sodium metasilicate, aqueous ammonia, ethylamine, diethylamine, dimethylethanolamine, tetramethylammonium hydroxide, tetraethylammonium hydroxide, corrin, pyrrole, piperidine, or 1,8-diazabicyclo-[5,4,0]-7-undecene dissolved at a concentration of 0.001% by mass to 10% by mass, and preferably 0.01% by mass to 1% by mass. When the developer is an aqueous alkaline solution, the alkaline concentration is adjusted such that the pH preferably becomes 11 to 13, and more preferably becomes 11.5 to 12.5.

The aqueous alkaline solution may contain an appropriate amount of a water-soluble organic solvent such as methanol and ethanol, a surfactant, and the like.

The developing temperature is typically in the range of 20° C. to 30° C. and the developing time is 20 seconds to 90 seconds.

Any development method can be used, such as a dipping mode, a shower mode, a spray mode, or the like of the development method, which may be combined with a swing mode, a spin mode, an ultrasonic mode, or the like. Uneven development can also be prevented by wetting the surface to be developed with water or the like before it contacts the developer. Further, development can also be carried out while the substrate is inclined.

In addition, puddle development is also used for manufacturing a color filter for a solid-state image pickup element.

After the development treatment, a rinsing treatment for washing off an excess of the developer, then drying, and then a heat treatment (postbaking) to complete curing are carried out.

The rinsing treatment is typically carried out using pure water, but alternatively, it may also be carried out using pure water during final washing while using recycled pure water during initial washing to save water, or by washing the substrate inclined, or by washing under ultrasonic irradiation.

Rinsing is followed by water removal and drying, and then a heat treatment typically at about 200° C. to 250° C. is carried out. This heat treatment (postbaking) can be carried out on the developed coated film by continuous or batch operation using a heating means such as a hot plate, a convection oven (hot-air circulation dryer), or a high-frequency heater under the conditions described above.

A color filter including multiple colored cured films (colored patterns) can be manufactured by successively repeating the above steps for each color to suit a desired number of hues.

The color filter of the present invention has a high contrast, an even color density, and good color properties so that they can be suitably used for a solid-state image pickup element or a liquid crystal display element.

—Step (C)—

In particular, in the method for manufacturing a color filter of the present invention, the colored pattern (pixel) formed by using a curable coloring composition of the present invention can also be postexposed by irradiation with ultraviolet rays.

—Step (D)—

The colored pattern postexposed by irradiation with ultraviolet rays as described above is preferably further subjected to a heat treatment. The heat treatment (so-called postbaking) of the formed colored pattern allows the colored pattern to be further cured. This heat treatment can be carried out using, for example, a hot plate, various heaters, ovens, or the like.

The temperature for the heat treatment is preferably 100° C. to 300° C., more preferably 150° C. to 250° C. Further, the heating time is preferably about 10 minutes to 120 minutes.

The colored pattern obtained in this manner constitutes a pixel in a color filter. When a color filter having multiple hue pixels is to be prepared, the step (A), the step (B), and optionally the step (C) or the step (D) may be repeated to suit a desired number of colors.

Alternatively, the step (C) and/or the step (D) may be carried out each time when the formation, exposure and development of a monochromatic curable coloring composition layer is completed (for each color), or the step (C) and/or the step (D) may be carried out once after the formation, exposure and development of all curable coloring composition layers of a desired number of colors have been completed.

Furthermore, it is also possible to apply the curable coloring composition of the present invention to a method for manufacturing a color filter including a dry etching step. One example of such as a production method is a production method including a step of forming a curable coloring composition layer using the curable coloring composition of the present invention, a step of forming a photoresist layer on the curable coloring composition layer, a step of patterning a photoresist layer by carrying out exposure and development to obtain a resist pattern, and a step of dry-etching the curable coloring composition layer using the resist pattern as an etching mask. In the case where the curable coloring composition of the present invention is used for a method for manufacturing a color filter including a dry-etching step, it may be a photocurable composition or a thermocurable composition. In the case of the thermocurable composition, a thermocuring agent can be used, and as the thermocuring agent, a compound having two or more epoxy groups in one molecule is preferable.

The color filter obtained by the method for manufacturing the color filter of the present invention (the color filter of the present invention) is excellent in hue and contrast since the curable coloring composition of the present invention is used.

The color filter of the present invention can be used for a liquid crystal display element or a solid-state image pickup element, and particularly suitable for use in a liquid crystal display device. In the case where it is used for a liquid crystal display device, an image having excellent spectroscopic properties and contrast can be displayed while achieving a good hue by using a dye as a colorant.

The foregoing description relates to the curable coloring composition of the present invention mainly for applications in which it is used for forming colored patterns in a color filter, but it can also be applied for forming black matrices separating colored patterns (pixels) constituting the color filter.

Black matrices on a substrate can be formed by the respective steps of coating, exposure and development using a curable coloring composition containing a processed pigment of black pigment such as carbon black and titanium black, optionally followed by postbaking.

[Liquid Crystal Display Device]

The liquid crystal display element and the solid-state image pickup element of the present invention include the color filter of the present invention. More specifically, a panel which is the liquid crystal display element of the present invention can be obtained by forming a polarizing film on the inner side of a color filter to face an electrode substrate and filling the gap with liquid crystals and sealing it, for example. Alternatively, the solid-state image pickup element of the present invention can be obtained by forming a color filter on a light-receiving element, for example.

The definition of display devices or details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention may be used for a liquid crystal display device using a color TFT system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching driving system such as IPS and a pixel division system such as MVA, or to STN, TN, VA, OCS, FFS, R-OCB, and the like.

In addition, the color filter in the present invention can be provided to a Color-filter On Array (COA) system which is a bright and high-definition system.

If the color filter of the present invention is used in a liquid crystal display device, high contrast can be realized when the color filter is combined with a three-wavelength tube of a cold cathode tube known in the related art. Further, if a light source of LED in red, green, and blue (RGB-LED) is used as a backlight, a liquid crystal display device having high luminance, high color purity, and good color reproducibility can be provided.

[Solid-State Image Pickup Element]

The curable coloring composition of the present invention can be preferably used in the applications of a solid-state image pickup element. A configuration of the solid-state image pickup element is not particularly limited as long as it includes a color filter manufactured using the curable coloring composition of the present invention and functions as a solid-state image pickup element, examples thereof include the configurations as follows.

The solid-state image pickup element is configured as follows: a plurality of photodiodes forming a light-receiving area of the solid-state imaging element (for example, a CCD image sensor and a CMOS image sensor) and a transmission electrode made of, for example, polysilicon are provided on a substrate; a light shielding film which is made of, for example, tungsten and has openings corresponding to only light-receiving portions of the photodiodes is provided on the photodiodes and the transmission electrode; a device protecting film which is made of, for example, silicon nitride is formed on the light shielding film so as to cover the entire surface of the light shielding film and the light-receiving portions of the photodiodes; and the color filter for a solid-state image pickup element according to the present invention is provided on the device protecting film.

In addition, the solid-state image pickup element may also be configured such that it has a light-collecting unit (for example, a microlens. This shall apply hereinafter) on a device protective layer and under a color filter (on the side closer to a supporter) or has a light-collecting unit on a color filter.

EXAMPLES

Hereinafter, the present invention will be described in more detail with reference to Examples, but the present invention is not limited to Examples below as long as it is within the gist thereof. Further, unless otherwise specified, the "part(s)" is (are) based on mass.

Synthetic Example 1

Synthesis of Compound (I-1)

A mixed solution of sodium 3-aminobenzenesulfonate (10 parts by weight), cyclohexyl bromide (20 parts by weight), and NMP (10 parts by weight) was reacted at 160° C. for 4 days.

To the reaction solution was added ethyl acetate (30 parts by weight), the precipitated solid was filtered, and then the solid was cleaned with a small amount of cold water to obtain N-cyclohexylaminobenzenesulfonate.

Subsequently, bisdiethylaminobenzophenone (8 parts by weight) and toluene (50 parts by weight) were mixed, phosphorus oxychloride (10 parts by weight) was added thereto, and the mixture was stirred at 100° C. for 6 hours.

The reaction solution was poured into cold water and the separated triarylmethane dye was collected by separation using decantation. To the triarylmethane dye collected by separation were added acetonitrile (50 parts by weight), trifluoromethanesulfonamide (10 parts by weight), and potassium carbonate (8 parts by weight), and the mixture was stirred at room temperature for 3 hours.

To the reaction solution was added water, the precipitated crystals were filtered, and then the crystals were cleaned with a mixed solution of methanol/water to obtain 3 g of an exemplary compound (I-1).

$^1$H-NMR (CDCl$_3$) δ 1.0-1.8 (m, 10H), 1.4 (t, 12H), 3.2 (m, 1H), 3.5 (q, 8H), 6.2 (brs, 1H), 7.0-8.0 (m, 11H)

Synthetic Example 2

Synthesis of Compound (I-3)

By the same procedure as in Example 1 except that sodium 3-aminobenzenesulfonate was changed to aminonaphthalenesulfonic acid, 4 g of an exemplary compound (I-3) was obtained.

$^1$H-NMR (CDCl$_3$) δ 1.0-1.8 (m, 10H), 1.4 (t, 12H), 3.3 (m, 1H), 3.5 (q, 8H), 7.2 (brs, 1H), 7.0-8.0 (m, 13H)

Synthetic Example 3

Synthesis of Compound (I-9)

A mixed solution of Acid Blue 90 (10 parts by weight) and phosphorus oxychloride (30 parts by weight) was reacted at 120° C. for 8 hours. The reaction solution was poured into cold water and the separated triarylmethane dye was collected by separation using decantation. To the triarylmethane dye collected by separation were added acetonitrile (50 parts by weight), trifluoromethanesulfonamide (15 parts by weight), and potassium carbonate (20 parts by weight), and the mixture was stirred at room temperature for 3 hours.

The reaction solution was filtered and then the crystals were cleaned with a mixed solution of methanol/water to obtain 5 g of an exemplary compound (I-9).

$^1$H-NMR (CDCl$_3$) δ 1.0 (t, 6H), 1.2 (t, 3H), 2.0 (s, 6H), 3.4 (s, 4H), 3.6 (q, 2H), 7.1-8.0 (m, 23H)

Synthetic Example 4

Synthesis of Compound (I-10)

A mixture of 2-phenylindole (10 parts by weight) and propanesultone (30 parts by weight) was reacted at 100° C. for 3 hours, and ethyl acetate was added to the reaction solution to obtain 12 parts by weight of 2-phenylindole N-propylsulfonate. By the same procedure as for the exemplary compound (I-1) using the obtained indole derivative and diethylaminobenzophenone, 3 g of an exemplary compound (I-10) was obtained.

$^1$H-NMR (CDCl$_3$) δ 1.4 (t, 12H), 1.8 (m, 2H), 2.4 (d, 2H), 3.0 (d, 2H), 3.4 (q, 8H), 7.0-8.0 (m, 17H)

The following compound described in Example 2 of WO2010/123071A was used as a comparative compound 1.

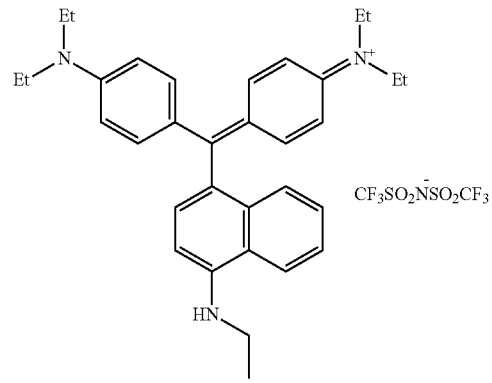

The following compound described in Example 1 of JP2013-87260A was used as a comparative compound 2 (Et represents an ethyl group and Bu represents a butyl group).

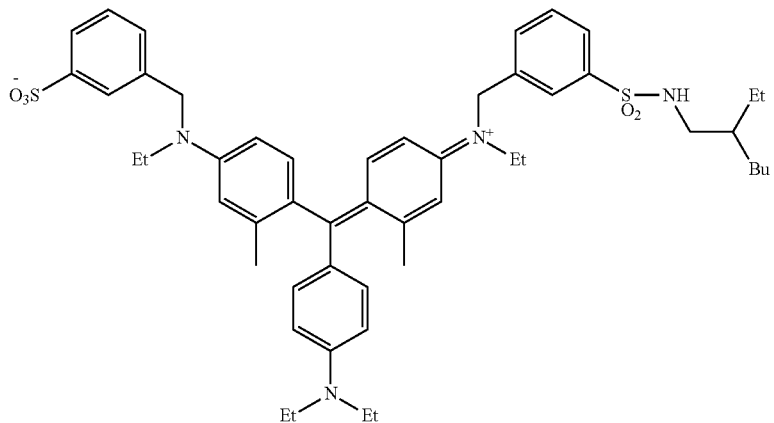

Next, the respective components used in the preparation of a curable coloring composition are shown below.

(T-1) Photopolymerizing compound: KAYARAD DPHA (manufactured by Nippon Kayaku Co., Ltd., a mixture of dipentaerythritol pentaacrylate and dipentaerythritol hexaacrylate)

(U-1) Binder resin: A propylene glycol monomethylether acetate solution (solid content of 40.0% by mass, acid value of 100 mgKOH/g) of a benzyl methacrylate/methacrylic acid (85/15 [mass ratio]) copolymer (weight average molecular weight: 12,000)

(V-3) Photopolymerization initiator: an oxime-based compound having the following structure (Et represents an ethyl group and Ac represents an acetyl group)

(X-1) Solvent: Propylene glycol monomethyl ether acetate
(X-2) Solvent: Ethyl 3-ethoxypropionate
(Z-1) Surfactant: Megaface F781-F (manufactured by DIC Corporation)

<Manufacture of Blue Colored Film>
(Preparation of Curable Coloring Composition (Coating Liquid))

The components having the following composition were mixed to prepare a curable coloring composition 1.
<<Composition>>

| | |
|---|---|
| Exemplary compound I-1 Triarylmethane compound | 2 parts by mass |
| (T-1) | 10.3 parts by mass |
| (U-1) | 21.2 parts by mass (value in terms of solid content: 8.5 parts by mass) |
| (V-3) | 1.0 part by mass |
| (X-1) | 7.2 parts by mass |
| (X-2) | 0.4 parts by mass |
| (Z-1) | 0.006 parts by mass |

In the same manner as for the curable coloring composition 1 except that a type of a dye such as a triarylmethane compound was changed as shown in the following table, curable coloring compositions 2 to 13 were prepared.

<Evaluation>
<<Heat Resistance>>
The colored film was heated at 230° C. for 40 minutes and then a change in chromaticity, that is, an ΔEab value was calculated. The ΔEab value was calculated from the UV-Vis spectra before and after heating. A smaller ΔEab value indicates superior heat resistance.

<<Solvent Resistance (Difference in Chromaticity)>>
The cured film that had been heated at 230° C. for 20 minutes were deposited in N-methylpyrrolidone (NMP) at 25° C. for 10 minutes, and the UV-Vis spectra before and after deposition and immersion was measured to calculate a color change index ΔEab. Further, in the case where the value of ΔEab is 3 or less, it is considered that the change in color is small and excellent solvent resistance is obtained.

<<Voltage Holding Ratio>>
The curable coloring composition was coated on a glass substrate equipped with an ITO electrode (trade name: 1737, manufactured by Corning) such that the film thickness after drying would be 2.0 and this was dried (prebaked) in an oven at 90° C. for 60 seconds. Thereafter, the coating film was exposed at 100 mJ/cm$^2$ (with an illuminance of 20 mW/cm$^2$), not through a mask, and developed at 25° C. using a 1% aqueous solution of an alkali developer (trade name: CDK-1, manufactured by FUJIFILM Electronic Materials Co., Ltd.), and this coating film after water-washing and drying was subjected to a heating treatment (post-baked) in an oven at 230° C. for 30 minutes to form a cured film. Then, the substrate on which the cured film had been formed and the substrate on which only an ITO electrode was deposited in a predetermined shape were adhered to each other using a sealing agent that was mixed with 5-μm glass beads, and a liquid crystal MJ971189 (trade name) manufactured by Merck was injected between the substrates, thereby manufacturing a liquid crystal cell.

Then, the liquid crystal cell was put into a constant-temperature bath at 70° C. for 48 hours, and then the voltage holding ratio of the liquid crystal cell was measured under the following measurement conditions, using a liquid crystal voltage holding ratio measurement system, Model VHR-1A (trade name), manufactured by Toyo Corporation, and evaluated with scores shown in the following criteria. A higher score indicates a better voltage holding ratio.

—Measurement Conditions—
Distance between electrodes: 5 μM to 15 μm,
Pulse amplitude of applied voltage: 5 V
Pulse frequency of applied voltage: 60 Hz
Pulse width of applied voltage: 16.67 msec
   Voltage holding ratio: Value of a voltage applied at a liquid crystal potential difference/0 msec after 16.7 msec Evaluation Criteria
5: 90% or more
4: From 85% to less than 90%
3: From 80% to less than 85%
2: From 75% to less than 80%
1: Less than 75%

TABLE 1

| Coloring curable composition | | Dye | Heat resistance | Solvent resistance | Voltage holding ratio |
|---|---|---|---|---|---|
| Example 1 | 1 | I-1 | 4.0 | 3.8 | 4 |
| Example 2 | 2 | I-2 | 2.8 | 3 | 5 |
| Example 3 | 3 | I-3 | 3.0 | 3.2 | 5 |
| Example 4 | 4 | I-4 | 3.2 | 3.4 | 4 |
| Example 5 | 5 | I-5 | 3.5 | 3.4 | 4 |
| Example 6 | 6 | I-6 | 3.7 | 3.5 | 4 |
| Example 7 | 7 | I-7 | 3.7 | 3.4 | 4 |
| Example 8 | 8 | I-8 | 3.7 | 3.3 | 4 |
| Example 9 | 9 | I-9 | 4.2 | 4.4 | 3 |
| Example 10 | 10 | I-10 | 4.3 | 3.5 | 5 |
| Example 11 | 11 | I-102 | 3.2 | 3.2 | 5 |
| Example 12 | 12 | I-104 | 3.0 | 3.3 | 5 |
| Example 13 | 13 | I-105 | 3.1 | 3.2 | 5 |
| Comparative Example 1 | 14 | Comparative compound 1 | 8.4 | 6.2 | 2 |
| Comparative Example 2 | 15 | Comparative compound 2 | >10 | 5.2 | 1 |

From the table, it can be seen that in Examples 1 to 13, using the curable coloring composition including a triarylmethane compound having a structure represented by General Formula (1) and a structure represented by the following General Formula (2) in the same molecule, the heat resistance, the solvent resistance, and the voltage holding ratio were excellent. On the other hand, in Comparative Example 1, using the curable coloring composition 11 having a dye of an intermolecular salt, not the curable coloring composition including a triarylmethane compound having a structure represented by General Formula (1) and a structure represented by the following General Formula (2) in the same molecule; and Comparative Example 2, using the curable coloring composition 12 having an intermolecular sulfonate, not the curable coloring composition including a triarylmethane compound having a structure represented by General Formula (1) and a structure represented by the following General Formula (2) in the same molecule, the heat resistance, the solvent resistance, and the voltage holding ratio deteriorate, as compared with those in Examples 1 to 13.

What is claimed is:

1. A curable coloring composition comprising a triarylmethane compound having a structure represented by the following General Formula (1) and a structure represented by the following General Formula (2) in the same molecule:

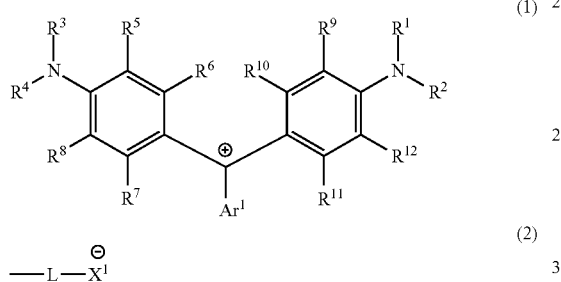

(1)

$$\overset{\ominus}{-}L-X^1$$ (2)

General Formula (2A)
-L$^1$-(structure represented by General Formula (2))

in General Formula (1), R$^1$ to R$^4$ each independently represents a hydrogen atom, an alkyl group which may be substituted with the structure represented by General Formula (2), or an aryl group which may be substituted with the structure represented by General Formula (2), R$^5$ to R$^{12}$ each independently represents a hydrogen atom, an alkyl group which may be substituted with the structure represented by General Formula (2), a structure represented by General Formula (2A), or a structure represented by General Formula (2), Ar$^1$ represents a phenyl group which may have a substituent, a naphthyl group which may have a substituent, or a heteroaromatic group which may have a substituent, and these groups may further be substituted with the structure represented by General Formula (2) or the structure represented by General Formula (2A); and in General Formula (2), X$^1$ is —SO$_2$NR$^{30}$, and L represents a single bond, a fluorine-substituted alkylene group, or a fluorine-substituted phenylene group, and R$^{30}$ represents an electron-withdrawing group, and in General Formula (2A), L$^1$ represents a divalent linking group.

2. The curable coloring composition according to claim 1, wherein R$^{30}$ is a halogen-substituted alkylsulfonyl group, a halogen-substituted arylsulfonyl group, a halogen-substituted alkylcarbonyl group, or a halogen-substituted arylcarbonyl group.

3. The curable coloring composition according to claim 1, wherein in General Formula (1), Ar$^1$ is represented by any one of the following General Formulae (3) to (5):

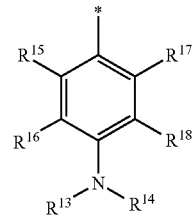

(3)

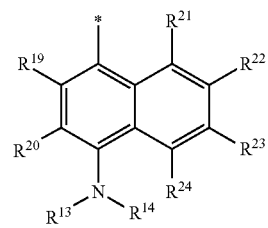

(4)

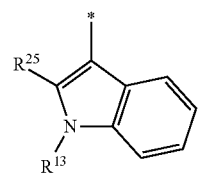

(5)

in General Formulae (3) to (5), R$^{13}$ to R$^{25}$ each independently represents a hydrogen atom, an alkyl group which may be substituted with the structure represented by General Formula (2), or an aryl group which may be substituted with the structure represented by General Formula (2); and * represents a site of bonding to a carbon atom in General Formula (1).

4. The curable coloring composition according to claim 3, wherein the structure represented by General Formula (2) is substituted with at least one of R$^1$, R$^2$, R$^3$ and R$^4$ in General Formula (1), R$^{13}$ and R$^{14}$ in General Formula (3) or (4), and R$^{13}$ in General Formula (5).

5. The curable coloring composition according to claim 3, wherein at least one of R$^7$ in General Formula (1), R$^{12}$ in General Formula (1), R$^{13}$ in General Formula (3), and R$^{14}$ in General Formula (3) is a structure represented by General Formula (2A).

6. The curable coloring composition according to claim 1, wherein the structure represented by General Formula (2) is substituted with at least one of R$^1$, R$^2$, R$^3$, R$^4$, and Ar$^1$ in General Formula (1).

7. The curable coloring composition according to claim 1, wherein at least one of R$^7$ and R$^{12}$ in General Formula (1) is a structure represented by General Formula (2A) and/or the structure represented by General Formula (2A) is substituted with Ar$^1$.

8. The curable coloring composition according to claim 1, wherein the alkyl group which may be substituted with the structure represented by General Formula (2) is represented by the following General Formula (2B), and the aryl group which may be substituted with the structure represented by General Formula (2) is represented by the following General Formula (2C):

General Formula (2B)
-alkylene group-L$^2$-structure represented by General Formula (2)

wherein in General Formula (2B), L$^2$ represents a divalent linking group;

General Formula (2C)

-arylene group-$L^3$-structure represented by General Formula (2)

wherein in General Formula (2C), $L^3$ represents a divalent linking group.

9. The curable coloring composition according to claim 1, further comprising a polymerizing compound and a photopolymerization initiator.

10. The curable coloring composition according to claim 1, for use in forming a colored layer of a color filter.

11. A cured film formed by curing the curable coloring composition according to claim 1.

12. A color filter comprising the cured film according to claim 11.

13. A solid-state image pickup element or a picture display device, comprising the color filter according to claim 12.

14. A method for manufacturing a color filter, comprising:
coating the curable coloring composition according to claim 1 onto a substrate to form a curable coloring composition layer;
patternwise exposing the curable coloring composition layer; and
removing an unexposed area by development to form a colored pattern.

15. A color filter manufactured by the method for manufacturing a color filter according to claim 14.

16. A method for manufacturing a color filter, comprising:
coating the curable coloring composition according to claim 1 onto a substrate to form a curable coloring composition layer, and curing the layer to form a curable coloring composition layer;
forming a photoresist layer on the curable coloring composition layer;
patterning the photoresist layer by exposure and development to obtain a resist pattern; and
dry-etching the colored layer using the resist pattern as an etching mask.

17. A curable coloring composition comprising a triarylmethane compound having a structure represented by the following General Formula (1) and a structure represented by the following General Formula (2) in the same molecule:

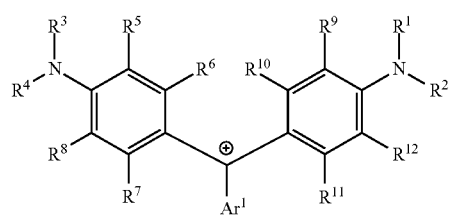

(1)

(2)

in General Formula (1), $R^1$ to $R^4$ each independently represents a hydrogen atom, an alkyl group which may be substituted with the structure represented by General Formula (2), or an aryl group which may be substituted with the structure represented by General Formula (2), $R^5$ to $R^{12}$ each independently represents a hydrogen atom, an alkyl group which may be substituted with the structure represented by General Formula (2), or a structure represented by General Formula (2), $Ar^1$ represents a phenyl group which may have a substituent, a naphthyl group which may have a substituent, or a heteroaromatic group which may have a substituent, and these groups may further be substituted with the structure represented by General Formula (2); and in General Formula (2), $X^1$ is $-SO_2NR^{30}$, and L represents a single bond, a fluorine-substituted alkylene group, or a fluorine-substituted phenylene group, and $R^{30}$ represents an electron-withdrawing group.

18. A curable coloring composition comprising a triarylmethane compound having a structure represented by the following General Formula (1) and a structure represented by the following General Formula (2) in the same molecule:

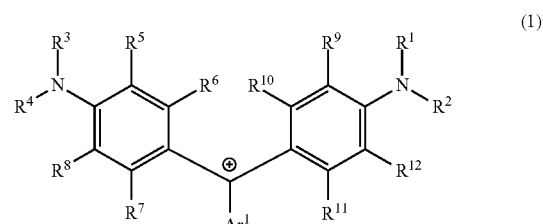

(1)

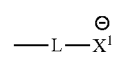

(2)

General Formula (2A)

-$L^1$-(structure represented by General Formula (2))

in General Formula (1), $R^1$ to $R^4$ each independently represents a hydrogen atom, an alkyl group which may be substituted with the structure represented by General Formula (2), or an aryl group which may be substituted with the structure represented by General Formula (2), $R^5$ to $R^{12}$ each independently represents a hydrogen atom, an alkyl group which may be substituted with the structure represented by General Formula (2), a structure represented by General Formula (2A), or a structure represented by General Formula (2), and $Ar^1$ is represented by any one of the following General Formulae (3) and (4); and in General Formula (2), in the case where $X^1$ is a $-SO_3$ group, L represents a fluorine-substituted alkylene group or a fluorine-substituted phenylene group, in the case where $X^1$ is $-SO_2NR^{30}$, L represents a single bond, a fluorine-substituted alkylene group, or a fluorine-substituted phenylene group, and $R^{30}$ represents an electron-withdrawing group, and in General Formula (2A), $L^1$ represents a divalent linking group:

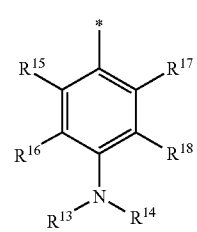

(3)

-continued

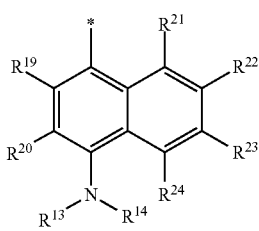

(4)

in General Formulae (3) and (4), $R^{13}$ to $R^{24}$ each independently represents a hydrogen atom, a structure represented by General Formula (2A), an alkyl group which may be substituted with the structure represented by General Formula (2), or an aryl group which may be substituted with the structure represented by General Formula (2); and * represents a site of bonding to a carbon atom in General Formula (1).

19. The curable coloring composition according to claim 18, wherein the curable composition is a composition comprising a triarylmethane compound having a structure represented by the following General Formula (1) and a structure represented by the following General Formula (2) in the same molecule:

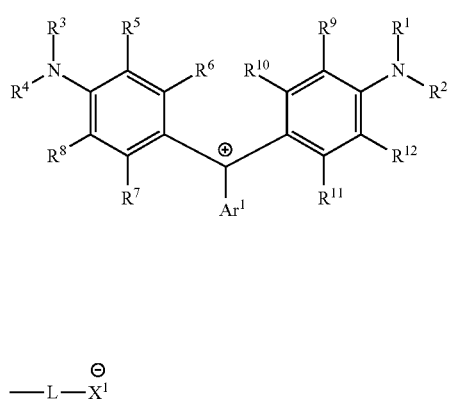

(1)

—L—X$^1$ $^{\ominus}$ (2)

in General Formula (1), $R^1$ to $R^4$ each independently represents a hydrogen atom, an alkyl group which may be substituted with the structure represented by General Formula (2), or an aryl group which may be substituted with the structure represented by General Formula (2), $R^5$ to $R^{12}$ each independently represents a hydrogen atom, an alkyl group which may be substituted with the structure represented by General Formula (2), or a structure represented by General Formula (2), and $Ar^1$ is represented by any one of the following General Formulae (3) and (4); and in General Formula (2), in the case where $X^1$ is a —SO$_3$ group, L represents a fluorine-substituted alkylene group or a fluorine-substituted phenylene group, in the case where $X^1$ is —SO$_2$NR$^{30}$, L represents a single bond, a fluorine-substituted alkylene group, or a fluorine-substituted phenylene group, and $R^{30}$ represents an electron-withdrawing group, and in General Formula (2A), $L^1$ represents a divalent linking group:

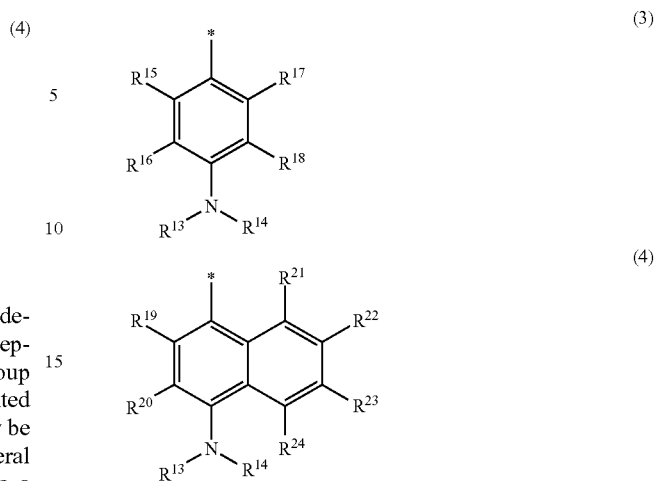

in General Formulae (3) and (4), $R^{13}$ to $R^{24}$ each independently represents a hydrogen atom, a structure represented by an alkyl group which may be substituted with the structure represented by General Formula (2), or an aryl group which may be substituted with the structure represented by General Formula (2); and * represents a site of bonding to a carbon atom in General Formula (1).

20. A curable coloring composition comprising a triarylmethane compound having a structure represented by the following General Formula (1) and a structure represented by the following General Formula (2) in the same molecule:

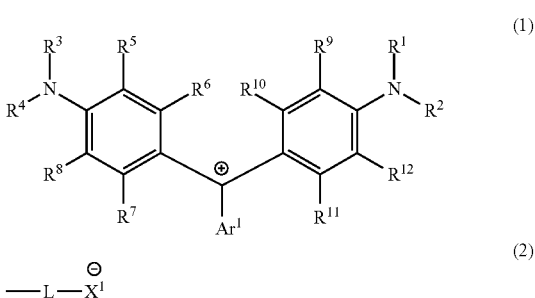

(1)

—L—X$^1$ $^{\ominus}$ (2)

General Formula (2A)
-L$^1$-(structure represented by General Formula (2))
in General Formula (1), $R^1$ to $R^4$ each independently represents a hydrogen atom, an alkyl group which may be substituted with the structure represented by General Formula (2), or an aryl group which may be substituted with the structure represented by General Formula (2), $R^5$ to $R^{12}$ each independently represents a hydrogen atom, an alkyl group which may be substituted with the structure represented by General Formula (2), a structure represented by General Formula (2A), or a structure represented by General Formula (2), $Ar^1$ represents a phenyl group which may have a substituent, a naphthyl group which may have a substituent, or a heteroaromatic group which may have a substituent, and these groups may further be substituted with the structure represented by General Formula (2) or the structure represented by General Formula (2A); and in General Formula (2), $X^1$ is represented by —$SO_2NSO_2R^{26}$ or —$SO_2NCOR^{27}$, provided that $R^{26}$ and $R^{27}$ each independently represents a fluorine-substituted alkyl group or a fluorine-substituted aryl group, L represents a single bond, a fluorine-substituted alkylene group, or a fluorine-substituted phenylene group, and $R^{30}$ represents an electron-withdrawing group, and in General Formula (2A), $L^1$ represents a divalent linking group.

21. The curable coloring composition according to claim 20, wherein the curable composition is a composition comprising a triarylmethane compound having a structure represented by the following General Formula (1) and a structure represented by the following General Formula (2) in the same molecule:

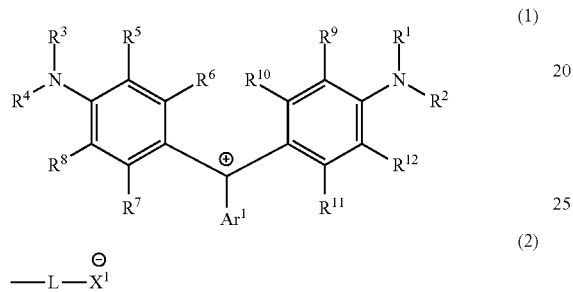

in General Formula (1), $R^1$ to $R^4$ each independently represents a hydrogen atom, an alkyl group which may be substituted with the structure represented by General Formula (2), or an aryl group which may be substituted with the structure represented by General Formula (2), $R^5$ to $R^{12}$ each independently represents a hydrogen atom, an alkyl group which may be substituted with the structure represented by General Formula (2), or a structure represented by General Formula (2), $Ar^1$ represents a phenyl group which may have a substituent, a naphthyl group which may have a substituent, or a heteroaromatic group which may have a substituent, and these groups may further be substituted with the structure represented by General Formula (2); and in General Formula (2), $X^1$ is represented by —$SO_2NSO_2R^{26}$ or —$SO_2NCOR^{27}$, provided that $R^{26}$ and $R^{27}$ each independently represents a fluorine-substituted alkyl group or a fluorine-substituted aryl group, L represents a single bond, a fluorine-substituted alkylene group, or a fluorine-substituted phenylene group, and $R^{30}$ represents an electron-withdrawing group, and in General Formula (2A), $L^1$ represents a divalent linking group.

22. A triarylmethane compound represented by any one of the following formulae:

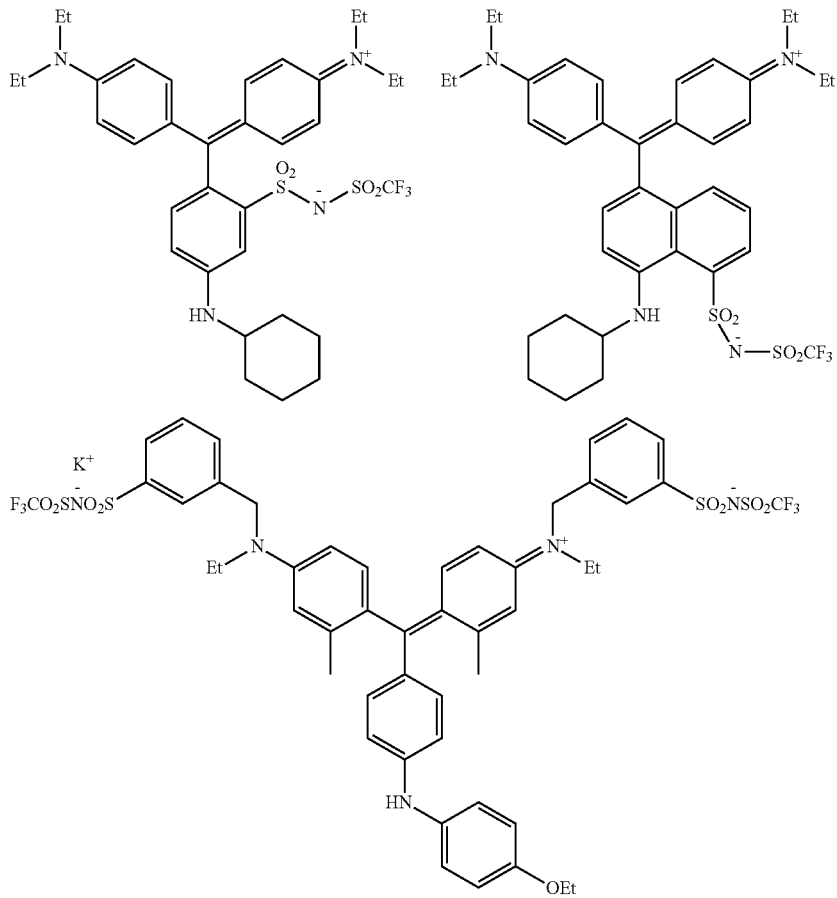

-continued
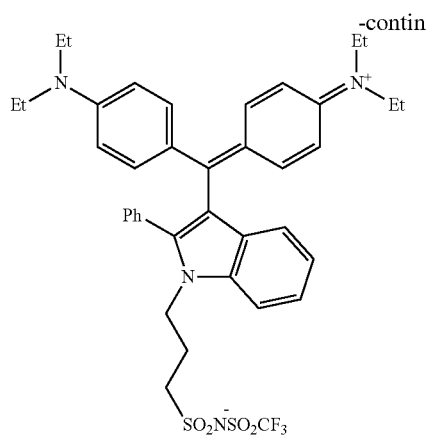
wherein in the formulae, Et represents an ethyl group and Ph represents a phenyl group.
* * * * *